(12) United States Patent
Ogawa et al.

(10) Patent No.: US 6,566,231 B2
(45) Date of Patent: May 20, 2003

(54) METHOD OF MANUFACTURING HIGH PERFORMANCE SEMICONDUCTOR DEVICE WITH REDUCED LATTICE DEFECTS IN THE ACTIVE REGION

(75) Inventors: Masahiro Ogawa, Osaka (JP); Kenji Orita, Osaka (JP); Masahiro Ishida, Osaka (JP); Shinji Nakamura, Osaka (JP); Osamu Imafuji, Osaka (JP); Masaaki Yuri, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 23 days.

(21) Appl. No.: 09/790,908

(22) Filed: Feb. 23, 2001

(65) Prior Publication Data

US 2001/0029086 A1 Oct. 11, 2001

(30) Foreign Application Priority Data

Feb. 24, 2000 (JP) ........................................ 2000-046927
Mar. 28, 2000 (JP) ........................................ 2000-088035

(51) Int. Cl.$^7$ ................................................ H01L 21/76
(52) U.S. Cl. ........................................ 438/448; 438/42
(58) Field of Search ................... 438/448, 42; 257/345, 257/103, 639; 117/95, 88

(56) References Cited

U.S. PATENT DOCUMENTS 6,153,010 A * 11/2000 Kiyoku et al. ................. 117/95

6,337,223 B1    1/2002  Kim et al.
6,348,096 B1 *  2/2002  Sunakawa et al. ............ 117/88
6,362,515 B2 *  3/2002  Hayakawa .................. 257/639

FOREIGN PATENT DOCUMENTS

| JP | 7-201745    | 8/1995  |
| JP | 8-255932    | 10/1996 |
| JP | 11-312825   | 11/1999 |
| JP | 11-340508   | 12/1999 |
| JP | 2000-21789  | 1/2000  |
| JP | 2000-156524 | 6/2000  |

* cited by examiner

*Primary Examiner*—David Nelms
*Assistant Examiner*—Thinh Nguyen
(74) *Attorney, Agent, or Firm*—Nixon Peabody LLP; Donald R. Studebaker

(57) ABSTRACT

A first semiconductor layer is epitaxially grown on a semiconductor substrate and patterned to form concave and convex portions. A second semiconductor layer is formed on the first semiconductor layer using a top epitaxial mask covering the top surface of the convex portion. Lattice defects D propagating from the first semiconductor layer exist only in a region located above the center of the concave portion (a defect region Ra), while in the other region (a low defect region Rb) lattice defects D propagating from the first semiconductor layer hardly exist.

19 Claims, 12 Drawing Sheets

Fig. 5(b)    Light

METHOD OF MANUFACTURING HIGH PERFORMANCE SEMICONDUCTOR DEVICE WITH REDUCED LATTICE DEFECTS IN THE ACTIVE REGION

BACKGROUND OF THE INVENTION

The present invention relates to a semiconductor device, in particular, a nitride semiconductor device functioning as a blue laser, a field effect transistor for high-speed operation, and the like, a method for fabricating such a semiconductor device, and a method for fabricating a semiconductor substrate used in a semiconductor device There are conventionally known lasers and field effect transistors that use as the active region thereof a compound semiconductor layer made of a nitride semiconductor, in particular, a group III nitride typified by gallium nitride (GaN), aluminum nitride (AlN), and indium nitride (InN). In other words, many techniques utilizing features of nitride semiconductors already exist, including forming lasers (for example, blue lasers) that emit short-wavelength light utilizing the broad band gap of nitride semiconductors, and forming field effect transistors achieving high-speed operation utilizing the high mobility (traveling velocity) of carriers in nitride semiconductors.

FIG. 12 is a cross-sectional view of a conventional semiconductor device as a semiconductor laser using a nitride semiconductor. In FIG. 12, hatching of the cross section is omitted for clarification of the structure of defects in crystals. Referring to FIG. 12, on a substrate 101 made of n-type GaN, sequentially grown by epitaxy are an n-type GaN layer 111, an n-type AlGaN cladding layer 112, an n-type GaN optical guide layer 113, an undoped GaN active layer 114, a p-type GaN optical guide layer 115, a first p-type AlGaN cladding layer 116, a current narrowing layer 117 having an opening, a second p-type AlGaN cladding layer 118, and a p-type GaN contact layer 119 in this order. An n-side electrode 120 is formed on the bottom surface of the substrate 101, and a p-side electrode 121 is formed on the top surface of the p-type GaN contact layer 119.

The semiconductor device with the above construction includes the undoped GaN active layer 114 made of a nitride semiconductor. Therefore, by applying a voltage through the n-side electrode 120 and the p-side electrode 121, the semiconductor device can be used as a semiconductor laser device that oscillates blue light at an active region 114a of the undoped GaN active layer 114 located below the opening of the current narrowing layer 117.

The above conventional semiconductor device has a problem as follows. The substrate 101 intrinsically includes streaky lattice defects D (in particular, dislocations) extending vertically. Note that the substrate 101 also includes lattice defects such as dislocations extending in parallel with or in directions declined from the substrate plane. These dislocations have little relation to the cause of the problem to be described hereinafter, and thus are not shown in the figures. With the sequential epitaxial growth of the n-type GaN contact layer 111, the n-type AlGaN cladding layer 112, . . . on the substrate 101, the lattice defects extend upward, reaching the active region 114a of the undoped GaN active layer 114 located below the opening of the current narrowing layer 117.

In the semiconductor laser device, for laser oscillation, a high current must be applied to the active region 114a to generate an inversion state in the active region 114a. However, when such a high current is applied to the active region 114a that includes a number of lattice defects, deterioration of the laser oscillation function may possibly develop from the positions of the lattice defects and, as a result, the life and reliability of the semiconductor laser may be significantly reduced.

The above problem due to the existence of defects may arise, not only in semiconductor laser devices, but also in other semiconductor devices such as high-speed field effect transistors and Schottky diodes. For example, if a number of lattice defects exist in the channel region below the gate of a field effect transistor, the mobility of carriers decreases. This may possibly deteriorate the performance of the transistor.

As described above, a semiconductor device may possibly be deteriorated in performance due to lattice defects existing in the active region (carrier traveling region) thereof, such as the active layer in the case of a semiconductor laser device and the channel region in the case of a transistor.

SUMMARY OF THE INVENTION

An object of the present invention is providing a semiconductor device with high reliability and high performance capable of reducing the number of lattice defects in the active region thereof, a method for fabricating such a semiconductor device, and a method for fabricating a semiconductor substrate used in a semiconductor device.

The semiconductor device of the present invention includes: a substrate having a first semiconductor layer; at least one convex portion formed in the first semiconductor layer, the convex portion having a top surface and a side face intersecting with the top surface; a coat layer formed to cover at least part of the top surface and leave open at least part of the side face of the convex portion of the first semiconductor layer, the coat layer having a function of suppressing epitaxial growth of a semiconductor on the first semiconductor layer; and a second semiconductor layer formed on the first semiconductor layer by epitaxial growth, wherein a region of the second semiconductor layer located above the convex portion operates as an active region.

With the above construction, the following effects are obtained. A semiconductor crystal epitaxially growing from the side face of the convex portion of the first semiconductor layer is deposited in a direction roughly normal to the side face. During this crystal growth, lattice defects exposed on the side face of the first semiconductor layer are incorporated in the crystal constituting the second semiconductor layer, extending in the second semiconductor layer in a direction roughly normal to the side face of the convex portion, that is, in a direction away from the convex portion. Therefore, the lattice defects in the first semiconductor layer deposited by side-direction growth of the crystal epitaxially grown from the side face of the convex portion, such as the portion located above the coat layer. Thus, the region of the second semiconductor layer located above the convex porion constitutes a low defect region, and a semiconductor device having its active region in this low defect region can exhibit good characteristics. For example, when the device is a semiconductor laser device, the light emitting characteristics are suppressed from deteriorating. When the device is a field effect transistor, the carrier traveling characteristics are improved.

The coat layer may cover a portion of the semiconductor layer other than the top surface of the convex portion. This reduces the possibility of propagation of the lattice defects in the first semiconductor layer into the second semiconductor layer, and thus it is possible to provide a semiconductor device in which the defect density of the second semiconductor layer is lower.

At least two convex portions may be formed, and the coat layer may also cover a bottom surface of a concave portion formed between the at least two convex portions. Lattice defects extending from the side faces of the two convex portions sandwiching the concave portion (side faces of the concave portion) in a direction roughly normal to the side faces in the second semiconductor layer concentrate near the center of the concave portion and are united into roughly one streak, which then extends upward. Contrarily, no lattice defects propagate from the bottom surface of the concave portion into the second semiconductor layer. This greatly reduces the defect region in the second semiconductor layer, and thus further reduces the defect density of the entire second semiconductor layer.

A plurality of convex portions may be formed, and the top surfaces of the convex portions may constitute a stripe pattern. Thus, a semiconductor device having a strip structure suitable for a semiconductor laser device is provided.

The coat layer may also have a stripe pattern.

The coat layer may be made of a material selected from an oxide, a nitride, and a metal. In particular, the coat layer is preferably made of a material selected from silicon oxide, silicon nitride, and tungsten. More preferably, the coat layer is made of aluminum oxide.

The first and second semiconductor layers are preferably made of a Group III nitride.

The semiconductor device may further include a third semiconductor layer formed on the top surface of the convex portion of the first semiconductor layer, and the coat layer may be formed by oxidizing a surface portion of the third semiconductor layer. By appropriately selecting the material constituting the third semiconductor layer, the adhesion between the coat layer and the first semiconductor layer can be improved. This makes it possible to improve the yield at the fabrication of the semiconductor device.

The third semiconductor layer may be made of an Al-containing semiconductor, and the coat layer may be made of an oxide containing Al as a constituent element. This improves the adhesion between the coat layer and the first semiconductor layer, and thus can improve the yield at the fabrication of the semiconductor device The above third semiconductor layer may be made of $Al_xGa_{1-x}As_yN_{1-y}$ ($0<x\leq 1$, $0\leq y\leq 1$) such as AlAs.

The semiconductor device may further include an Al-containing underlying semiconductor layer immediately below the first semiconductor layer, and the convex portion of the first semiconductor layer may be a mesa-shaped convex portion isolated on the underlying semiconductor layer.

In the case of the above construction, the coat layer may also cover a bottom surface region of the underlying semiconductor layer that is not covered with the convex portion, and a surface portion of the underlying semiconductor layer in the bottom surface region may be oxidized. This further reduces the defect density of the second semiconductor layer.

The underlying semiconductor layer may be made of a material selected from the preferable materials exemplified for the third semiconductor layer.

The first method for fabricating a semiconductor device of the present invention includes the steps of: (a) forming a coat layer on a first semiconductor layer of a substrate, the coat layer being made of a material having a function of suppressing epitaxial growth of a semiconductor on the first semiconductor layer; (b) etching the coat layer and the first semiconductor layer to form in the first semiconductor layer at least one convex portion having a top surface and a side face intersecting with the top surface while forming a top epitaxial mask made of the coat layer on the at least one convex portion; (c) forming a second semiconductor layer on the first semiconductor layer by epitaxial growth after the step (b); and (d) forming a semiconductor element operating using a region of the second semiconductor layer located above the convex portion as an active region.

By the above method, the following effects are obtained. In the step (c), a semiconductor crystal epitaxially growing from the side face of the convex portion of the first semiconductor layer is deposited in a direction roughly normal to the side face. During this crystal growth, lattice defects exposed on the side face of the first semiconductor layer are incorporated in the crystal constituting the second semiconductor layer in a direction roughly normal to the side face of the convex portion, that is, in a direction away from the convex portion. Therefore, the lattice defects in the first semiconductor layer hardly extend in the portion of the second semiconductor layer deposited by side-direction growth of the crystal epitaxially grown from the side face of the convex portion, such as the portion located above the top epitaxial mask. Thus, the region of the second semiconductor layer located above the convex portion constitutes a low defect region, and a semiconductor device having its active region in this low defect region can exhibit good characteristics. For example, it is possible to provide a laser device where the light emitting characteristics are less deteriorated and a field effect transistor having superior carrier traveling characteristics.

In the step (b), at least two convex portions may be formed, and the method may further include the step of forming a bottom epitaxial mask on a bottom surface of a concave portion sandwiched by the two convex portions after the step (b) and before the step (c). This makes it possible to provide a semiconductor device in which the defect density of the second semiconductor layer is lower.

The method may further includes the steps of: forming an etching mask film after the step (a) and before the step (b); and patterning the etching mask film to form an etching mask after the step (a) and before the step (b), and in the step (b), the coat layer and the first semiconductor layer may be etched using the etching mask.

In the step (a), a film made of a material capable of selectively etching the first semiconductor layer may be formed as the coat layer. In the step (b), the coat layer may be patterned to form an etching mask, and then the first semiconductor layer may be etched using the etching mask. In the step (c), the second semiconductor layer may be epitaxially grown using the etching mask as an epitaxial mask.

In the step (a), a $SiO_2$ film may be formed as the coat layer. This facilitates the formation of the epitaxial mask.

The second method for fabricating a semiconductor device of the present invention includes the steps of: (a) forming an etching mask on a first semiconductor layer of a substrate; (b) etching the first semiconductor layer using the etching mask to form in the first semiconductor layer at least one convex portion having a top surface having a size smaller than the etching mask and a side face intersecting with the top surface; (c) forming a second semiconductor layer by epitaxial growth on the first semiconductor layer after the step (b); and (d) forming a semiconductor element operating using a region of the second semiconductor layer ranging from the side face of the convex portion to part of a bottom surface of a concave portion as an active region.

By the above method, as in the first method, it is possible to reduce the number of lattice defects in the portion of the second semiconductor layer deposited by side-direction growth of the crystal epitaxially grown from the side face of the convex portion of the first semiconductor layer. Lattice defects propagating from the top surface of the convex portion of the first semiconductor layer into the second semiconductor layer extend in a direction roughly normal to the top surface of the convex portion. In this relation, however, the area of the top surface of the convex portion is reduced. The defect density is small in the region of the second semiconductor layer ranging from the side face of the convex portion to part of the bottom surface of the concave portion. Thus, a semiconductor device having its active region in this region can exhibit good characteristics. For example, it is possible to provide a semiconductor laser device in which the light emitting characteristics are less deteriorated and a field effect transistor having superior carrier traveling characteristics.

In the step (a), the etching mask may be a film made of a material etched during the etching in the step (b) and reduced in lateral size by the etching. In the step (a), also, the etching mask may be made of a material having translucency, and in the step (b), the size of the top surface of the convex portion may be reduced by etching a portion of the first semiconductor layer located below the etching mask while irradiating the first semiconductor layer with light from above the etching mask. In particular, in the step (b), the tilt angle of the side face of the convex portion may be controlled to be a desired value by selection of etching conditions.

The third method for fabricating a semiconductor device of the present invention includes the steps of: (a) forming a first semiconductor layer made of a Group III nitride on a substrate; (b) forming a second semiconductor layer made of a material having a function of adhering to the first semiconductor layer on the first semiconductor layer; (c) forming an etching mask on the second semiconductor layer; (d) etching the first and second semiconductor layers using the etching mask to form in the first semiconductor layer at least one convex portion having a top surface and a side face intersecting with the top surface; (e) forming a top epitaxial mask on the second semiconductor layer remaining on the top surface of the convex portion of the first semiconductor layer; (f) forming a third semiconductor layer on the first semiconductor layer by epitaxial growth after the step (e); and (g) forming a semiconductor element operating using a region of the third semiconductor layer located above the convex portion as an active region.

By the above method, basically the same effects as those obtained by the first fabrication method are obtained. In addition, this method can improve the adhesion between the top epitaxial mask and the first semiconductor layer, and thus improve the yield at the fabrication of the semiconductor device.

In the step (c), the etching mask may be formed by patterning a SiO$_2$ film.

The step (c) may be performed by reactive ion etching with a gas containing chlorine.

The fourth method for fabricating a semiconductor device of the present invention includes the steps of: (a) forming an Al-containing underlying semiconductor layer and a first semiconductor layer made of a Group III nitride sequentially on a substrate; (b) forming an etching mask on the first semiconductor layer; (c) etching the first semiconductor layer using the etching mask to form in the first semiconductor layer at least one convex portion having a top surface and a side face intersecting with the top surface; (d) forming a top epitaxial mask on the top surface of the convex portion of the first semiconductor layer; (e) forming a second semiconductor layer on the first semiconductor layer by epitaxial growth after the step (d); and (f) forming a semiconductor element operating using a region of the second semiconductor layer located above the convex portion as an active region.

By the above method, basically the same effects as those obtained in the first fabrication method are obtained.

The method may further includes the step of forming a third semiconductor layer made of a material having a function of adhering to the first semiconductor layer on the first semiconductor layer after the step (a) and before the step (b). In the step (b), the etching mask may be formed on the third semiconductor layer. In the step (c), part of the third semiconductor layer may be left on the top surface of the convex portion, and in the step (d), the top epitaxial mask may be formed on the part of the third semiconductor layer. This permits improvement of the yield at the fabrication of the semiconductor device as described above.

When the third semiconductor layer is an AlAs layer, in the step (d), the top epitaxial mask can be formed by oxidizing a surface portion of the AlAs layer.

In the step (c), the first semiconductor layer may be etched until the underlying semiconductor layer is exposed to form the mesa-shaped convex portion on the underlying semiconductor layer, and the method may further includes the step of forming a bottom epitaxial mask by oxidizing an exposed surface portion of the underlying semiconductor layer.

The method for fabricating a semiconductor substrate of the present invention includes the steps of: (a) forming an etching mask on a first semiconductor layer made of a Group III nitride formed on a substrate for crystal growth; (b) etching the first semiconductor layer using the etching mask to form in the first semiconductor layer at least one convex portion having a top surface and a side face intersecting with the top surface; (c) forming a second semiconductor layer on the first semiconductor layer by epitaxial growth after the step (b); and (d) removing the substrate for crystal growth.

By the above method, it is possible to provide a semiconductor substrate suitable for fabrication of the semiconductor device of the present invention.

The method may further include the step of forming a top epitaxial mask used in the step (c) on the top surface of the convex portion of the first semiconductor layer.

When the substrate for crystal growth includes a base plate and an Al-containing underlying semiconductor layer formed on the base plate, in the step (b), the first semiconductor layer may be etched until the underlying semiconductor layer is exposed, and the top epitaxial mask may be formed by oxidizing an exposed surface portion of the underlying semiconductor layer before the step (c).

BRIEF DESCRIPTION OF THE DRAWINGS

FIGS. 4(a) through 4(c) are cross-sectional views illustrating; a fabrication process of a semiconductor device of the third embodiment of the present invention.

FIGS. 5(a) through 5(c) are cross-sectional views illustrating a fabrication process of a semiconductor device of the fourth embodiment of the present invention.

DESCRIPTION OF THE PREFERRED EMBODIMENTS (First embodiment)

FIGS. 1(a) through 1(f) are cross-sectional views illustrating a fabrication process of a semiconductor device of the first embodiment of the present invention. FIG. 2 is a cross-sectional view of the semiconductor device of the first embodiment.

Figure 1A:
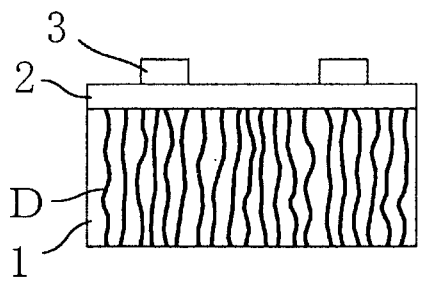
FIGS. 1(a) through 1(f) are cross-sectional views illustrating a fabrication process of a semiconductor device of the first embodiment of the present invention.
Figure 2:
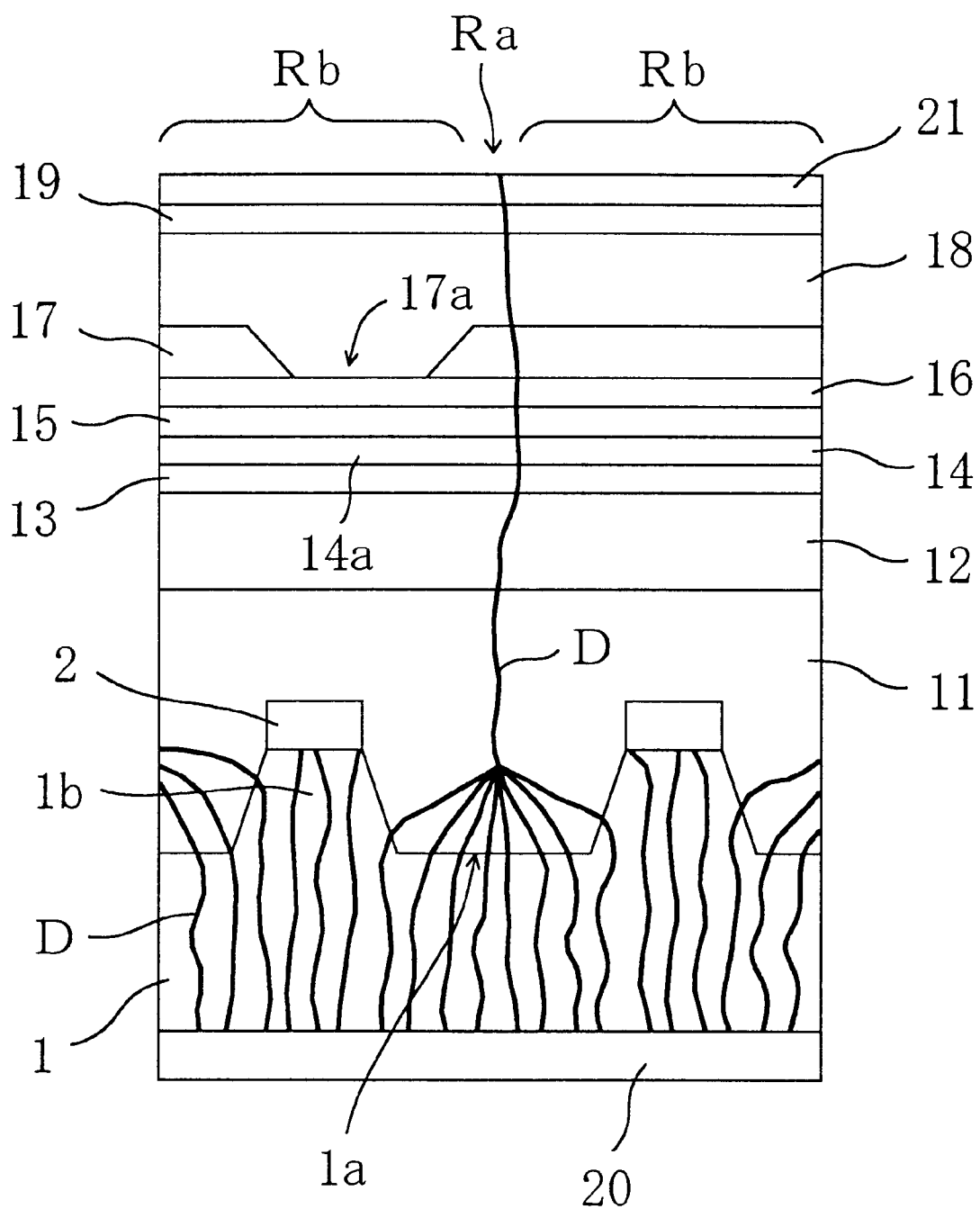
FIG. 2 is a cross-sectional view of the semiconductor device of the first embodiment of the present invention.

In the step shown in FIG. 1(a), an n-type GaN substrate 1 of which the major surface is the (0001) plane (an n-type GaN (0001) substrate) is prepared. The substrate 1 generally includes a number of streaky lattice defects D inside. On the substrate 1, formed is a $SiO_2$ film 2x having a thickness of 0.1 μm as a first mask layer. Since the first mask layer serves as an epitaxial mask at a later stage, it should be made of a material that does not permit a semiconductor layer to be grown thereon so that the semiconductor layer is selectively grown only on the portions of the substrate 1 exposed in openings of the first mask layer after the first mask layer is patterned to form the openings. Specific examples of the material of the first mask layer include $SiO_2$, which is used in this embodiment, oxides of metals such as tungsten, nitrides such as $Si_3N_4$, and metals.

An etching mask film made of a silicon nitride film is then formed on the $SiO_2$ film 2x as the first mask layer and patterned into an etching mask 3 composed of a number of stripes covering the $SiO_2$ film 2x. The pitch of the stripes of the etching mask 3 is 10 μm and the space between the adjacent stripes, that is, the width of the openings between the stripes is 2 μm. The width of the stripes and the space between the stripes are preferably 1 to 10 μm. The length direction of the stripes is roughly in parallel with the <11–20> orientation (a-axis orientation) of a GaN crystal constituting the substrate 1.

Figure 1B:
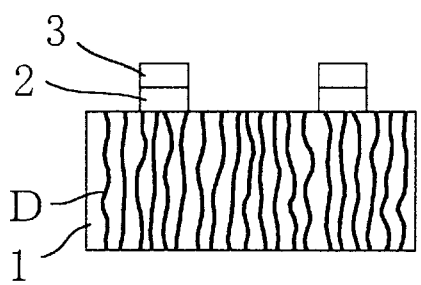

In the step shown in FIG. 1(b), the $SiO_2$ film 2x is patterned using the etching mask 3 to form a top epitaxial mask 2 under the etching mask 3.

Figure 1C:
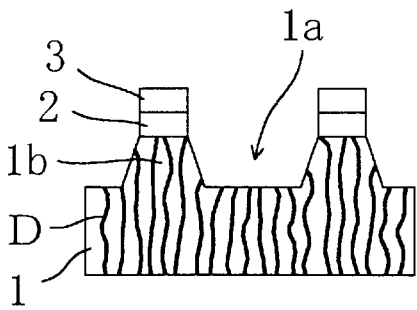

In the step shown in FIG. 1(c), the portions of the substrate 1 exposed in the openings of the top epitaxial mask 2 and the etching mask 3 are etched, to form concave portions 1a having a bottom surface inside the substrate 1, leaving non-etched portions between the concave portions 1a as convex portions 1b. The side faces at the boundary between the concave portions 1a and the convex portions 1b are planes (for example, the r-plane (1-102)) intersecting with the top surfaces due to etching anisotropy of the crystal planes of the GaN crystal. The step formed by the concave and convex portions, that is, the depth of the concave portions 1a (the height of the convex portions 1b) is about 2 μm. Herein, the angle formed between the line normal to the major surface of the substrate 1 (the bottom surface of the concave portion) and the line normal to the side face is called a side-face tilt angle (this angle is equal to the angle formed between the side face and the major surface).

The substrate 1 may be etched by wet etching with an acid such as $H_3PO_4$ and HCl or an alkali such as KOH and NaOH. Dry etching with a gas such as $BCl_3$ may also be used.

Figure 1D:
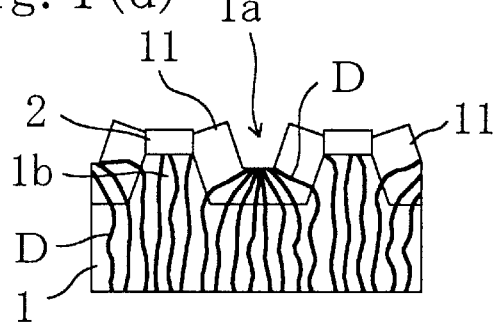

In the step shown in FIG. 1(d), after removal of the etching mask 3, with the top epitaxial mask 2 left unremoved, GaN crystals are grown on the bottom surfaces and side faces of the concave portions 1a by metallorganic vapor phase epitaxy (MOVPE). During this step, n-type impurities (for example, Si) are implanted in the GaN crystals by in-situ doping, to form an n-type GaN layer 11.

Propagation Process of Lattice Defect with Epitaxial Growth

During the epitaxial growth, those of the lattice defects D in the substrate 1 that are exposed on the bottom surfaces and the side faces of the concave portions 1a propagate into the n-type GaN layer 11 as the n-type GaN layer 11 grows by epitaxy. With the deposition of the n-type GaN layer 11, the lattice defects D that have propagated into the n-type GaN layer 11 from the side faces of each of the concave portions 1a (the side faces of the convex portions 1b) and the bottom surface of the concave portion 1a concentrate in a narrow region of the n-type GaN layer 11 located in the center of the concave portion 1a. The reason is as follows. The GaN crystals epitaxially growing from the side faces of the concave portion 1a grows in a direction roughly normal to the side faces, and thus the growth direction of the GaN crystals from the side faces of the concave portion 1a is inclined toward the center of the concave portion 1a. With this crystal growth, those of the streaky lattice defects D in the substrate 1 that have propagated into the n-type GaN layer 11 from the side faces of the concave portion 1a extend in a direction roughly normal to the side faces of the convex portions 1b. Others of the streaky lattice defects D in the substrate 1 that have propagated into the n-type GaN layer 11 from the bottom surface of the concave portion 1a extend roughly vertically toward near the center of the concave portion 1a. In this way, the lattice defects D extending from the bottom surface of the concave portion 1a and the lattice defects D extending from the side faces of the concave portion 1a concentrate in the region of the n-type GaN layer 11 located in the center of the concave portion 1a.

When the major surface of the substrate 1 is the (0001) plane, which is the densest plane, the epitaxial growth rate is low on the bottom surface of the concave portion 1a that is the (0001) plane. In this case, in particular, the lattice defects D swiftly concentrate in the region of the n-type GaN layer 11 located in the center of the concave portion 1a.

No GaN crystal grows from the top epitaxial mask 2. However, GaN crystals grown from the side faces of the convex portions 1b in a direction roughly normal to the side faces further grow in the side direction from the sides thereof, to permit GaN crystals to be deposited along the surface of the top epitaxial mask 2. During this growth, lattice defects D exposed on the side faces of the convex portions 1b, if any, propagate into the n-type GaN layer 11 in a direction normal to the side faces of the convex portions 1b. Therefore, presumably, the lattice defects D in the substrate 1 hardly propagate into the portions of the n-type GaN layer 11 that have been deposited by the side-direction growth of the GaN crystals grown from the side faces of the convex portions 1b in a direction roughly normal to the side faces.

Figure 1E:
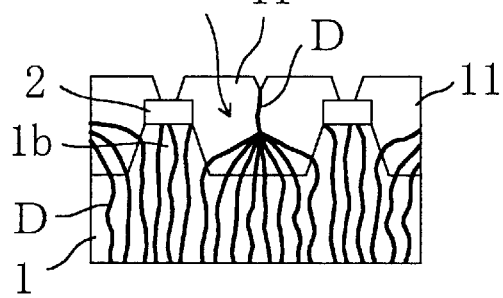

As the epitaxial growth of the n-type GaN layer 11 proceeds, as shown in FIG. 1(e), a number of lattice defects D concentrating in the region of the n-type GaN layer 11 located near the center of the concave portion 1a are finally united into one streak. The GaN crystals covering the side faces of the stripes of the top epitaxial mask 2 extend in the lateral direction to cover the top surface of the top epitaxial mask 2. During this growth, the lattice defects D in the substrate 1 presumably hardly propagate into the portions of the n-type GaN layer 11 that have been deposited by the side-direction growth of the GaN crystals grown from the side faces of the convex portions 1b in a direction roughly normal to the side faces, as described above.

Figure 1F:
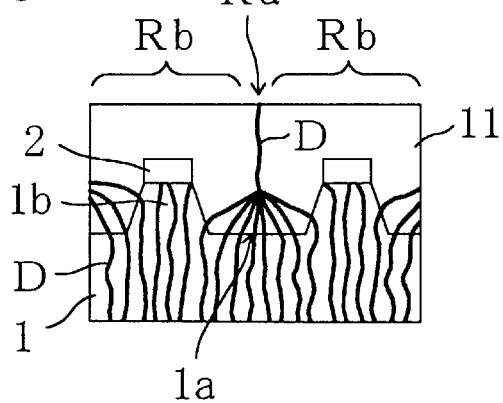

As the epitaxial growth of the n-type GaN layer 11 further proceeds, as shown in FIG. 1(f), the n-type GaN layer 11 covers the overall surfaces of the concave portions 1a and the convex portions 1b of the substrate 1, and the top surface of the n-type GaN layer 11 is flattened. In the upper portion (especially in the surface portion) of the resultant n-type GaN layer 11, the lattice defects D propagating from the substrate 1 only exist in the regions thereof located above the center of the concave portions 1a. In the other regions, lattice defects D propagating from the substrate 1 hardly exist. That is, the n-type GaN layer 11 has defect regions Ra located above the center of the concave portions 1a of the substrate 1 and the other regions in which the number of lattice defects is small, namely, low defect regions Rb.

Note that FIGS. 1(a) through 1(f) illustrate the construction of the semiconductor device viewed from one cross-section. When viewed from the top (plan view) in the step shown in FIG. 1(f), the defect region Ra will be observed as extending along near the center of the concave portion 1a of the substrate 1 (that is, roughly the center between the adjacent stripes of the top epitaxial mask 2).

Structure of Semiconductor Laser Device

Thereafter, as shown in FIG. 2, formed on the n-type GaN layer 11 by MOVPE (an epitaxial method) are: an n-type AlGaN cladding layer 12 having a thickness of 1 $\mu$m (mixed crystal ratio of Al:Ga is 10:90); an n-type GaN optical guide layer 13 having a thickness of 0.3 $\mu$m; an InGaN multiple quantum well active layer 14; a p-type GaN optical guide layer 15 having a thickness of 0.05 $\mu$m; and a first p-type AlGaN cladding layer 16 having a thickness of 0.05 $\mu$m. The multiple quantum well active layer 14 is composed of an InGaN barrier layer having a thickness of 3 nm (not shown; mixed crystal ratio of In:Ga is 3:97) and an InGaN well layer having a thickness of 6 nm (not shown; mixed crystal ratio of In:Ga is 15:85).

On the first p-type AlGaN cladding layer 16, formed is a current narrowing layer 17 having a thickness of 0.5 $\mu$m that has a 2 $\mu$m wide opening 17a. The region of the InGaN multiple quantum well active layer 14 located below the opening 17a of the current narrowing layer 17 constitutes an active region 14a of the semiconductor laser device. Therefore, in the formation of the current narrowing layer 17, it is arranged so that the opening 17a is located above the low defect region Rb of the underlying first p-type AlGaN cladding layer 16. In this way, the number of lattice defects D can be reduced in the active region 14a of the semiconductor laser device. Thus, the laser oscillation function of the active region 14a is prevented from deteriorating, and the reliability of the semiconductor laser device can be improved.

In this embodiment, used as the material of the current narrowing layer 17 is n- type AlGaN that is opposite in conductivity type to the first p-type AlGaN cladding layer 16. Alternatively, a nitride semiconductor other than AlGaN, such as GaN, may also be used as the material of the current narrowing layer 17. An insulator such as AlN and SiO$_2$ may also be used. In the case of using a nitride semiconductor, the current narrowing layer 17 may be of a conductivity type opposite to that of the first p-type AlGaN cladding layer 16 or may be of a high-resistance type.

On the current narrowing layer 17, formed sequentially are a second p-type AlGaN cladding layer 18 having a thickness of 1 $\mu$m (mixed crystal ratio of Al:Ga is 10:90) and a p-type GaN contact layer 19 having a thickness of 0.1 $\mu$m. Thereafter, an n-side electrode 20 is formed on the substrate 1, and a p-side electrode 21 is formed on the p-type GaN contact layer 19.

With the above construction, a voltage is applied through the n-side electrode 20 and the p-side electrode 21, to enable the active region 14a of the InGaN multiple quantum well active layer 14 to emit light.

During the above crystal epitaxial growth, the lattice defects D in the n-type GaN layer 11 propagate into the n-type AlGaN cladding layer 12, the n-type GaN optical guide layer 13, the InGaN multiple quantum well active layer 14, the p-type GaN optical guide layer 15, the p-type AlGaN cladding layer 16, the current narrowing layer 17, the second p-type AlGaN cladding layer 18, and the p-type GaN contact layer 19. Accordingly, the regions of the respective layers located above the center of the concave portions 1a of the substrate 1 constitute defect regions Ra that have the lattice defects D, while the other regions constitute the regions in which the number of lattice defects is small, that is, low defect regions Rb.

Thus, in the semiconductor device (semiconductor laser device) of the present invention, in which the opening 17a of the current narrowing layer 17 is located above the low detect region Rb, it is possible to reduce the density of the lattice defects D in the active region 14a of the InGaN multiple quantum well active layer 14 located below the opening 17a, and thus the life and reliability of the semiconductor laser device can be improved.

A life test was performed for the semiconductor device of this embodiment and a conventional semiconductor device. The life test includes keeping constant the powers of laser light oscillated by a number of semiconductor laser devices at a temperature of 100° C. In the conventional semiconductor laser device, about a half of the samples were no more operable 1000 hours after the start of the life test. The remaining half exhibited significant deterioration in laser oscillation function, such as rise of the operating current by 50% on average. In the semiconductor laser of this embodiment, all the samples were still operable 1000 hours after the start of the life test. The rise of the operating current was 2% on average. Thus, the reliability improved in the semiconductor device of this embodiment.

(Second embodiment)

Figure 3A:
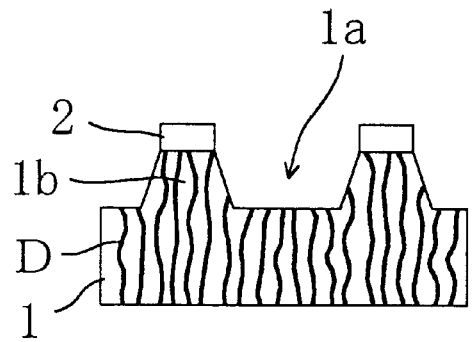
FIGS. 3(a) through 3(c) are cross-sectional views illustrating a fabrication process of a semiconductor device of the second embodiment of the present invention.
Figure 3B:
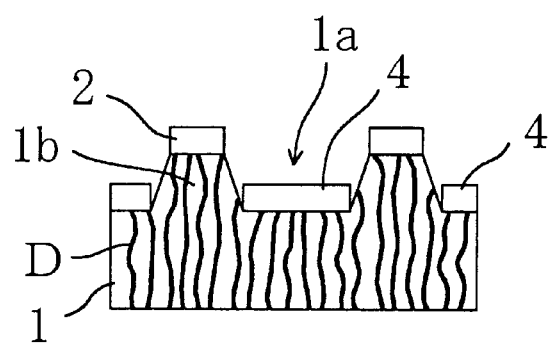
Figure 3C:
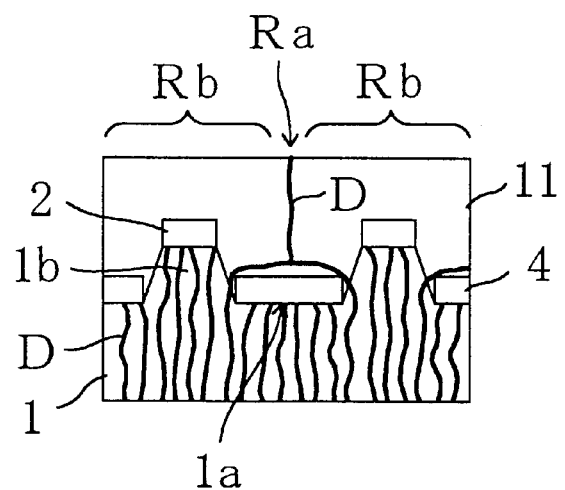

FIGS. 3(a) through 3(c) are cross-sectional views illustrating a fabrication process of a semiconductor device of the second embodiment of the present invention. Note that FIGS. 3(a), 3(b), and 3(c) illustrate only the steps corresponding to those shown in FIGS. 1(c) and 1(f). Steps corresponding to the steps shown in FIGS. 1(a), 1(b), 1(d), and 1(e) are basically the same as those in the first embodiment, and thus illustration is omitted here.

In this embodiment, in the step shown in FIG. 3(a), concave portions 1a and convex portions 1b are formed in the surface portion of the substrate 1 in the same manner as that in the steps shown in FIGS. 1(a) through 1(c) in the first embodiment. Note however that the etching mask 3 shown in FIG. 1(c) has been removed in FIG. 3(a).

In the step shown in FIG. 3(b), a bottom epitaxial mask 4 made of $SiO_2$ having a thickness of 0.1 μm is formed on the bottom surface of each of the concave portions 1a. The bottom epitaxial mask 4 should be made of a material that does not permit a semiconductor layer to be grown thereon so that the semiconductor layer is selectively grown only on the portions of the substrate 1 that are not covered with the bottom epitaxial mask 4 (specifically, on the side faces of the concave portions 1a). Specific examples of the material of the bottom epitaxial mask 4 include $SiO_2$, which is used in this embodiment, oxides of metal such as tungsten, nitrides such as $Si_3N_4$, and metals.

In the step shown in FIG. 3(c), an n-type GaN layer 11 is epitaxially grown on the concave portion 1a and the convex portion 1b by MOVPE. No GaN crystal is grown on the top epitaxial mask 2 and the bottom epitaxial mask 4 immediately after the start of the epitaxial growth of the n-type GaN layer 11. GaN crystals are grown only from the side faces of the convex portions 1b (side faces of the concave portions 1a). Thereafter, the surface of the top epitaxial mask 2 is covered with the GaN crystals grown from the side faces of the convex portions 1b as described in the first embodiment (see FIGS. 1(d) and 1(e)).

In this embodiment, unlike the first embodiment, the GaN crystals grown from the side faces of the convex portions 1b extend along the top surface of the bottom epitaxial mask 4. Therefore, the lattice defects D exposed on the bottom surface of each of the concave portion 1a are prevented from propagating into the n-type GaN layer 11, while only the lattice defects D exposed on the side faces of the concave portion 1a are allowed to propagate into the n-type GaN layer 11. As described in the first embodiment, the lattice defects D incorporated in the GaN crystals grown from the side faces of the convex portions 1b extend in a direction roughly normal to the side faces, concentrating in the region of the n-type GaN layer 11 located in the center of the concave portion 1a to be united into one streak.

Therefore, like the first embodiment, the lattice defects D propagating from the substrate 1 exist only in the regions of the n-type GaN layer 11 located near the center of the concave portions 1a, and in the other regions, lattice defects D propagating from the substrate 1 hardly exist. That is, the n-type GaN layer 11 has defect regions Ra located above the center of the concave portions 1a of the substrate 1 and the other regions in which the number of lattice defect is small, namely, low defect regions Rb.

The n-type GaN layer 11 finally covers the overall surfaces of the concave portions 1a and the convex portions 1b, and the top surface of the n-type GaN layer 11 is flattened. In the surface portion of the resultant n-type GaN layer 11, the lattice defects D propagating from the substrate 1 only exist in the defect regions Rb located above the center of the concave portions 1a. In the other regions, that is, in the low defect regions Rb, lattice defects D hardly exist.

Subsequently, as in the first embodiment, formed sequentially on the n-type GaN layer 11 are an n-type AlGaN cladding layer 12, an n-type GaN optical guide layer 13, an InGaN multiple quantum well active layer 14, a p-type GaN optical guide layer 15, a p-type AlGaN cladding layer 16, a current narrowing layer 17, a second p-type AlGaN cladding layer 18, and a p-type GaN contact layer 19, as shown in FIG. 2. Thereafter, an n-side electrode 20 is formed on the substrate 1, and a p-side electrode 21 is formed on the p-type GaN contact layer 19. The respective layers formed above the n-type GaN layer 11 also have the defect regions Ra and the low defect regions Rb at positions corresponding to those of the n-type GaN layer 11. In this way, the semiconductor laser device is fabricated. In this embodiment, also, the current narrowing layer 17 is formed so that the opening 17a is located above the low defect region Rb of the underlying first p-type AlGaN cladding layer 16 in the construction where the n-type GaN layer 11 in FIG. 2 is replaced with the n-type GaN layer 11 in this embodiment. In this way, the number of lattice defects D can be reduced in the active region 14a of the semiconductor laser device. Thus, the laser oscillation function of the active region 14a is prevented from deteriorating, and the reliability of the semiconductor laser device can be improved.

In the semiconductor device of this embodiment, the density of the lattice defects D in the region of the n-type GaN layer 11 located near the center of the concave portion 1a is reduced swiftly after the start of the epitaxial growth. Therefore, the n-type GaN layer 11 can be made thinner than that in the first embodiment. In addition, this embodiment, it is expected to obtain the effect that the low defect region Ra can be made narrower than that in the first embodiment.

The life test described in the first embodiment was also performed for the semiconductor device of the second embodiment. As a result, all of samples of the semiconductor laser of this embodiment were still operable 1000 hours after the start of the life test. The rise of the operating current was 2% on average. Thus, the reliability of the semiconductor device of this embodiment improved as in the first embodiment.

(Third embodiment)

Figure 4A:
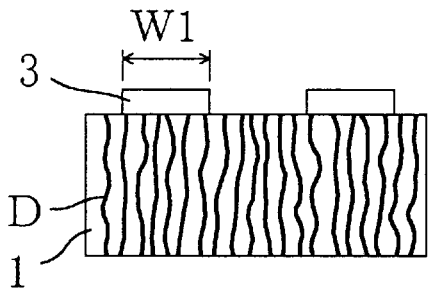
Figure 4A:
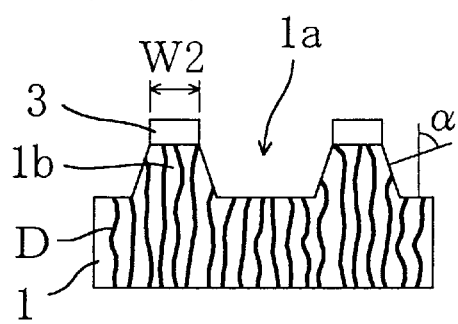
Figure 4A:
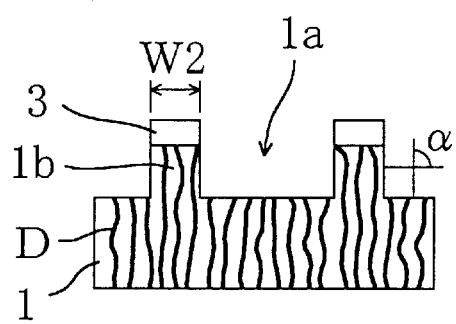
Figure 4C:
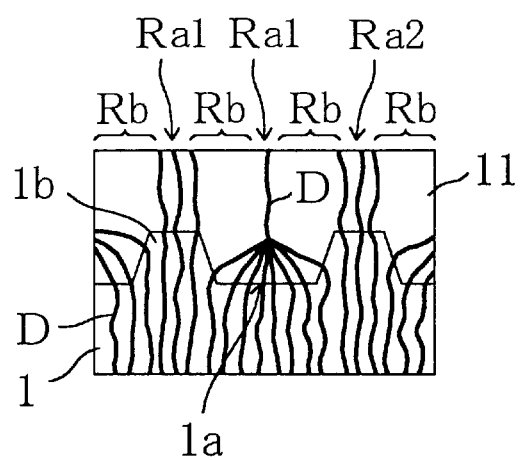

FIGS. 4(a) through 4(c) are cross-sectional views illustrating a fabrication process of a semiconductor device of the third embodiment of the present invention.

In the step shown in FIG. 4(a), an n-type GaN substrate 1 of which the major surface is the (0001) plane (an n-type GaN (0001) substrate) is prepared. The substrate 1 generally includes a number of streaky lattice defects D inside. An etching mask film is formed on the substrate 1 and patterned into a stripe-shaped etching mask 3 composed of a number of stripes covering the substrate 1. The etching mask should be made of a material that itself is also etched to some extent during the etching of the substrate 1. Specifically, a resist can be used as the material of the etching mask. The length direction of the stripes of the etching mask 3 is roughly in parallel with the <11–20> orientation (a-axis orientation) of a GaN crystal constituting the substrate 1.

In the step shown in FIG. 4(b-1), the portions of the substrate 1 exposed in the openings of the etching mask 3 are etched, to form concave portions 1a extending linearly along the major surface of the substrate 1, leaving non-etched portions between the adjacent concave portions 1a as convex portions 1b. The side faces at the boundary between the concave portions 1a and the convex portions 1b are tilted. The step formed by the concave and convex portions, that is, the depth of the concave portions 1a (the height of the convex portions 1b) is about 2 μm.

The substrate 1 may be etched by wet etching with an acid such as $H_3PO_4$ and HCl or an alkali such as KOH and NaOH. Dry etching with a gas such as $BCl_3$ may also be used.

Herein, the angle formed between the line normal to the major surface of the substrate 1 (the bottom surface of the concave portion) and the line normal to the side face is called a side-face tilt angle α (this angle is also equal to the angle formed between the side face and the major surface). The side-face tilt angle α of the concave portion 1a can be made smaller than 90° as shown in FIG. 4(b-1) by selection of the material of the etching mask 3, the etchant, and the etching conditions such as the etching temperature. In other words, the side-face tilt angle α is determined by the ratio of the etching rate at which the etching mask 2 is etched in the direction parallel to the major surface of the substrate 1 to the etching rate at which the substrate 1 is etched in the direction vertical to the major surface of the substrate 1. When the width of each stripe of the etching mask 3 at the original patterning shown in FIG. 4(a) is W1, the width W2 of each stripe of the etching mask 3 in the state shown in FIG. 4(b-1) is smaller than the original width W1.

An alternative to the above process step is also possible where the etching mask is not etched during the etching of the substrate 1 by selection of the material constituting the etching mask 3 or the etching conditions. In this case, as shown in FIG. 4(b-2), the width W2 of the etching mask 3 after the etching is the same as the original width W1, and the side-face tilt angle α of the concave portion 1a is 90°.

In the step shown in FIG. 4(c), after removal of the etching mask 3, an n-type GaN layer 11 is epitaxially grown on the substrate 1 by MOVPE. With the epitaxial growth of the n-type GaN layer 11, lattice defects D exposed on the bottom surface and the side faces of each of the concave portions 1a of the substrate 1 concentrate in the center of the concave portion 1a to be united into roughly one streaky lattice defect D by the function described in the first embodiment. Contrarily, lattice defects D exposed on the top surface of each of the convex portions 1b of the substrate 1 propagate in the n-type GaN layer 11 upwardly.

Finally, the n-type GaN layer 11 covers the concave portions 1a and the convex portions 1b of the substrate 1, and the top surface of the n-type GaN layer 11 is roughly flattened. In the upper portion of the n-type GaN layer 11, the lattice defects D propagating from the substrate 1 exist in first defect regions Ra1 located above the center of the concave portions 1a and second defect regions Ra2 located above the top surfaces of the convex portions 1b. The other regions, especially the regions each ranging from the side face of the convex portion 1b to part of the bottom surface of the concave portion 1a, constitute low defect regions Rb in which lattice defects D propagating from the substrate 1 hardly exist.

Subsequently, as in the first embodiment, formed sequentially on the n-type GaN layer 11 are an n-type AlGaN cladding layer 12, an n-type GaN optical guide layer 13, an InGaN multiple quantum well active layer 14, a p-type GaN optical guide layer 15, a p-type AlGaN cladding layer 16, a second p-type AlGaN cladding layer 18, and a p-type GaN contact layer 19, as shown in FIG. 2. Thereafter, an n-side electrode 20 is formed on the substrate 1, and a p-side electrode 21 is formed on the p-type GaN contact layer 19. The respective layers formed above the n-type GaN layer 11 also have the defect regions Ra and the low defect regions Rb at positions corresponding to those of the n-type GaN layer 11. In this way, the semiconductor laser device is fabricated. In this embodiment, also, the current narrowing layer 17 is formed so that the opening 17a is located above the low defect region Rb of the underlying first p-type AlGaN cladding layer 16 in the construction where the n-type GaN layer 11 in FIG. 2 is replaced with the n-type GaN layer 11 in this embodiment. In this way, the number of lattice defects D can be reduced in the active region 14a of the semiconductor laser device. Thus, the laser oscillation function of the active region 14a is prevented from deteriorating, and the reliability of the semiconductor laser device can be improved.

In this embodiment, in the step shown in FIG. 4(b-1) or 4(b-2), the side-face tilt angle α of the concave portion 1a of the substrate 1 can be controlled arbitrarily by selection of the material of the etching mask, the etchant, and the etching conditions. In addition, broad low defect regions Rb can be secured in the n-type GaN 1a layer 11 by reducing the area of the etching mask during the etching without using an epitaxial mask. For example, by greatly reducing the width W2 of the etching mask 3 shown in FIG. 4(b-1), the second defect regions Ra2 shown in FIG. 4(c) can be greatly narrowed and thus broad low defect regions Rb can be secured.

When the side-face tilt angle α of the convex portion 1b is set at 90° or an angle close to 90°, GaN crystals growing in the direction normal to the side faces of the convex portions 1b and GaN crystals growing from the bottom surface of the concave portion 1a soon join with each other. Therefore, the lattice defects D are swiftly united into one streak, and thus the number of lattice defects D in the region of the n-type GaN layer 11 located above the concave portion 1a can be reduced more effectively. Since it is presumed that lattice defects D are hardly exposed on the side faces having a tilt angle α of 90°, the number of lattice defects D can also be reduced more effectively. Also, by reducing the width W1 at the patterning of the etching mask 3 in the step shown in FIG. 4(a), it is possible to reduce the number of lattice defects D in the regions located above the convex portions 1b of the substrate 1.

The life test described in the first embodiment was also performed for the semiconductor device of the third embodiment. As a result, all of samples of the semiconductor laser of this embodiment were still operable 1000 hours after the start of the life test. The rise of the operating current was 2% on average. Thus, the reliability of the semiconductor device of this embodiment improved as in the first embodiment.

(Fourth embodiment)

Figure 5A:
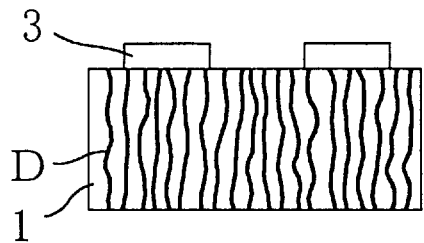
Figure 5A:
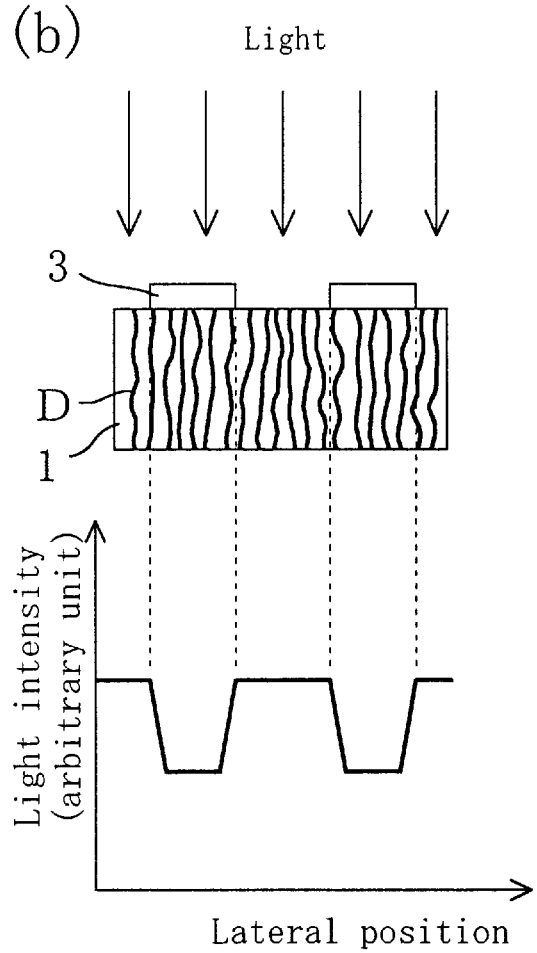
Figure 5C:
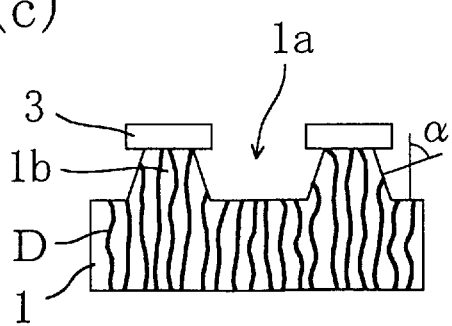

FIGS. 5(a) through 5(c) are cross-sectional views illustrating a fabrication process of a semiconductor device of the fourth embodiment of the present invention.

In the step shown in FIG. 5(a), an n-type GaN substrate 1 of which the major surface is the (0001) plane (an n-type GaN (0001) substrate) is prepared. The substrate 1 generally includes a number of streaky lattice defects D inside. An etching mask film is formed on the substrate 1 and patterned into a stripe-shaped etching mask 3 composed of a number of stripes covering the substrate 1. The etching mask should be made of a material that is not etched during the etching of the substrate 1 and is translucent to light used in the etching process for the substrate 1 to follow. Specifically, SiO$_2$ can be used as the material of the etching mask. The length direction of the stripes of the etching mask 3 is roughly in parallel with the <11–20> orientation (a-axis orientation) of a GaN crystal constituting the substrate 1.

In the step shown in the upper part of FIG. 5(b), the substrate 1 is irradiated with light, of which the intensity has a distribution as shown in the lower part of FIG. 5(b) at the surface of the substrate 1. In the lower part of FIG. 5(b), the axis of abscissa represents the lateral position on the top surface of the substrate 1 and the axis of ordinates represents the light intensity (arbitrary unit) at the top surface of the substrate 1. Since the etching mask 3 is translucent, light passes through not only the portions of the substrate 1 at the openings of the etching mask 3 but also the portions thereof covered with the etching mask 3.

The substrate 1 is etched under the irradiation of the top surface of the substrate 1 with light. During the etching of the substrate 1, the etching rate is proportional to the intensity of the light irradiated. Also, the light passes through not only the portions of the substrate 1 at the openings of the etching mask 3 but also the portions thereof covered with the etching mask 3 as described above. Therefore, not only the portions of the substrate 1 at the openings of the etching mask 3 but also the portions thereof covered with the etching mask 3 are put in an etching allowable state.

As the etching method utilizing light irradiation as described above, usable is an electrochemical etching method using a KOH solution or the like as an electrolyte, for example.

As shown in FIG. 5(c), as a result of the etching, concave portions 1a and convex portions 1b are formed in the surface portion of the substrate 1. The concave portions 1a intrude into portions underneath the etching mask 3. The ratio of the etching rate at the portions of the substrate 1 located at the openings of the etching mask 3 to the portions covered with the etching mask 3 is determined by the ratio of the light intensity of the former to the latter. It is therefore possible to control the side-face tilt angle α at the boundary between the concave portion 1a and the convex portion 1b, that is, the width of the intrusion of the concave portion 1a under the etching mask 3 by adjusting the transmittance of the etching mask 3, the etchant, the etching conditions such as the etching temperature, and the like.

Thereafter, as in the third embodiment, after removal of the etching mask 3, an n-type GaN layer 11 is epitaxially grown on the substrate 1 by MOVPE. With the epitaxial growth of the n-type GaN layer 11, lattice defects D exposed on the bottom surface and the side faces of each of the concave portions 1a of the substrate 1 concentrate in the center of the concave portion 1a to be united into roughly one streaky lattice defect D by the function described in the first embodiment. Contrarily, lattice defects D exposed on the top surface of each of the convex portions 1b of the substrate 1 propagate in the n-type GaN layer 11 upwardly.

Finally, the n-type GaN layer 11 covers the concave portions 1a and the convex portions 1b of the substrate 1, and the top surface of the n-type GaN layer 11 is roughly flattened. As in the third embodiment described with reference to FIG. 4(c), in the upper portion of the n-type GaN layer 11, the lattice defects D propagating from the substrate 1 exist in first defect regions Ra1 located above the center of the concave portions 1a and second defect regions Ra2 located above the top surfaces of the convex portions 1b. The other regions constitute low defect regions Rb in which lattice defects D propagating from the substrate 1 hardly exist.

Subsequently, as in the first embodiment, formed sequentially on the n-type GaN layer 11 are an n-type AlGaN cladding layer 12, an n-type GaN optical guide layer 13, an InGaN multiple quantum well active layer 14, a p-type GaN optical guide layer 15, a p-type AlGaN cladding layer 16, a second p-type AlGaN cladding layer 18, and a p-type GaN contact layer 19, as shown in FIG. 2. Thereafter, an n-side electrode 20 is formed on the substrate 1, and a p-side electrode 21 is formed on the p-type GaN contact layer 19. The respective layers formed above the n-type GaN layer 11 also have the defect regions Ra and the low defect regions Rb at positions corresponding to those of the n-type GaN layer 11. In this way, the semiconductor laser device is fabricated. In this embodiment, also, the current narrowing layer 17 is formed so that the opening thereof is located above the low defect region Rb of the underlying first p-type AlGaN cladding layer 16 in the construction where the n-type GaN layer 11 in FIG. 2 is replaced with the n-type GaN layer 11 in this embodiment. In this way, the number of lattice defects D can be reduced in the active region 14a of the semiconductor laser device. Thus, the laser oscillation function of the active region 14a is prevented from deteriorating, and the reliability of the semiconductor laser device can be improved.

In this embodiment, in the step shown in FIG. 5(c), the side-face tilt angle α of the convex portion 1b of the substrate 1 can be controlled arbitrarily by selection of the material of the etching mask, the etchant, the etching conditions, and the like. Therefore, as in the third embodiment, the side-face tilt angle α of the concave portion 1a and the convex portion 1b can be appropriately controlled so that the lattice defects D can be more concentrated. This further reduces the number of defects.

The life test described in the first embodiment was also performed for the semiconductor device of the fourth embodiment. As a result, all of samples of the semiconductor laser of this embodiment were still operable 1000 hours after the start of the life test. The rise of the operating current was 2% on average. Thus, the reliability of the semiconductor device of this embodiment improved as in the first embodiment.

(Fifth embodiment)

FIGS. 6(a) through 6(d) are cross-sectional views illustrating a fabrication process of a semiconductor device of the fifth embodiment of the present invention.

Figure 6A:
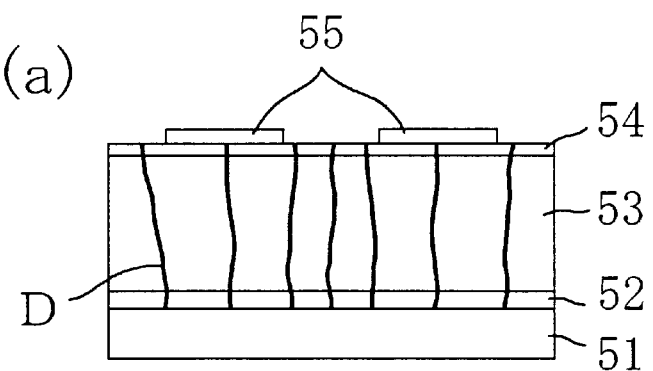
FIGS. 6(a) through 6(d) are cross-sectional views illustrating a fabrication process of a semiconductor device of the fifth embodiment of the present invention.

In the step shown in FIG. 6(a), a Si substrate 51 of which the major surface is the (111) plane is prepared. The Si substrate 51 is washed with an organic solvent and then placed on a susceptor in a reactor of a MOVPECVD apparatus (not shown). The Si substrate 51 is heated at 1000° C. for 30 minutes under flow of hydrogen gas fed into the reactor, to remove oxides on the Si substrate 51.

While the temperature of the Si substrate 51 is kept at 1000° C., trimethylaluminum ($Al(CH_3)_3$, hereinafter referred to as TMA) and ammonia ($NH_3$) are then supplied into the reactor, to epitaxially grow an AlN buffer layer 52 having a thickness of 50 nm.

Thereafter, trimethylgallium ($Ga(CH_3)_3$, hereinafter referred to as TMG) and $NH_3$ are supplied to epitaxially grow a first GaN layer 53 having a thickness of 3 μm on the AlN buffer layer 52. The thickness of the first GaN layer 53 is just required to be large enough to allow formation of steps therein. Specifically, the thickness of the first GaN layer 53 is preferably 100 nm or more, more preferably 1 to 5 μm. Hereinafter, the Si substrate 51 with some layer or layers formed thereon is simply called the "substrate".

The temperature of the substrate 1 is then reduced to 500° C., and arsine ($AsH_3$) and TMA are supplied to grow a first AlAs layer 54 having a thickness of 100 nm on the first GaN layer 53. The thickness of the first AlAs layer 54 is just required to be large enough to allow formation of an oxide film therein. Specifically, the thickness of the first AlAs layer 54 is preferably 5 to 500 nm, more preferably 50 to 200 nm.

The substrate is then removed from the MOVPE reactor, and a $SiO_2$ film having a thickness of 100 nm is formed on the first AlAs layer 54 by sputtering. The method for formation of the $SiO_2$ film is not specified, but vacuum evaporation, chemical vapor deposition (CVD), or the like may be employed. The $SiO_2$ film is then patterned by photolithography and dry etching, to form an etching mask 55. The etching mask 55 has a periodic stripe pattern having a stripe width of 5 μm and a space between stripes of 5 μm. That is, the width of the stripes constituting the stripe pattern of the etching mask 55 is 5 μm, and the space between the stripes, that is, the width of the openings between the stripes is 5 μm. The length direction of the stripes is roughly in parallel with the <11–20> orientation (a-axis orientation) of a GaN crystal constituting the substrate 1.

Figure 6B:
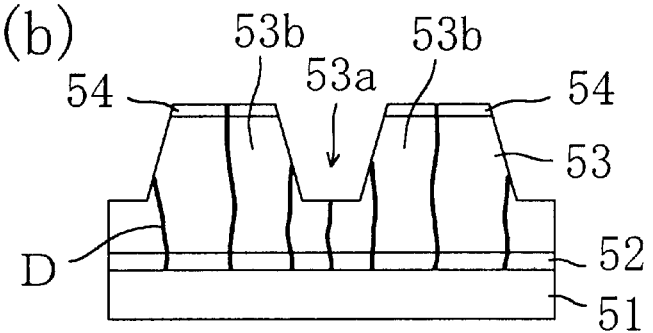

In the step shown in FIG. 6(b), the substrate is put in an etching apparatus, where the portions of the first AlAs layer 54 and the first GaN layer 53 that are exposed in the openings of the etching mask 55 are etched by reactive ion etching. As a result, formed are concave portions 53a extending through the first AlAs layer 54 and having a bottom surface inside the first GaN layer 53, leaving non-etched portions between the adjacent concave portions 53a as convex portions 53b. The side faces at the boundary between the concave portions 53a and the convex portions 53b are tilted. The step formed by the concave and convex portions, that is, the depth of the concave portions 53a (the height of the convex portions 53b) is about 2 μm. In this way, steps having a depth of 2 μm in the form of the concave portions 53a and the convex portions 53b are formed in the first GaN layer 53. As the etching gas in the reactive ion etching, a gas containing chlorine such as $BCl_3$ and $CCl_4$ may be preferably used. In this embodiment, a mixed gas of $BCl_3$ and $N_2$ (mixture ratio $BCl_3:N_2=2:1$) is fed at a flow rate of about 0.010 (l/m), and the gas pressure in the etching apparatus is set at 67 Pa. The etching mask 55 is then removed by selective etching.

In the formation of the steps between the concave portions 53a and the convex portions 53b by etching, the side-face tilt angle may be 90°, may be less than 90° forming a mesa cross section, or may be more than 90° forming an inverted-mesa cross section, as described in the third embodiment. In other words, the cross section of the concave portion 53a is not limited to that shown in FIG. 6(b), but may be of any shape as long as a semiconductor layer can be formed on the first GaN layer 53. The angle formed between the line normal to the major surface of the substrate 1 (the bottom surface of the concave portion) and the line normal to the side face thereof is called a side-face tilt angle (this angle is also equal to the angle formed between the side face and the major surface). As described in the third embodiment, the side-face tilt angle can be controlled arbitrarily by selection of the etchant and the etching conditions such as the etching temperature.

Figure 6C:
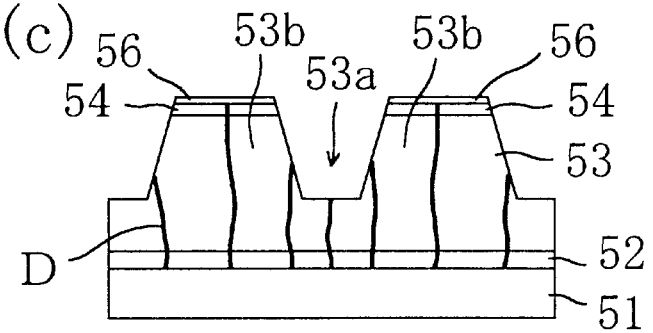

In the step shown in FIG. 6(c), the substrate is subjected to, heat treatment at 400° C. for 30 minutes in a water vapor atmosphere, to oxidize the surface portion of the first AlAs layer 54 forming a top epitaxial mask 56 made of an oxide film on the first AlAs layer 54. Since the rate of the oxidation of the first AlAs layer 54 is significantly high, it is well considered that the layers other than the first AlAs layer 54 have not been oxidized.

Figure 6D:
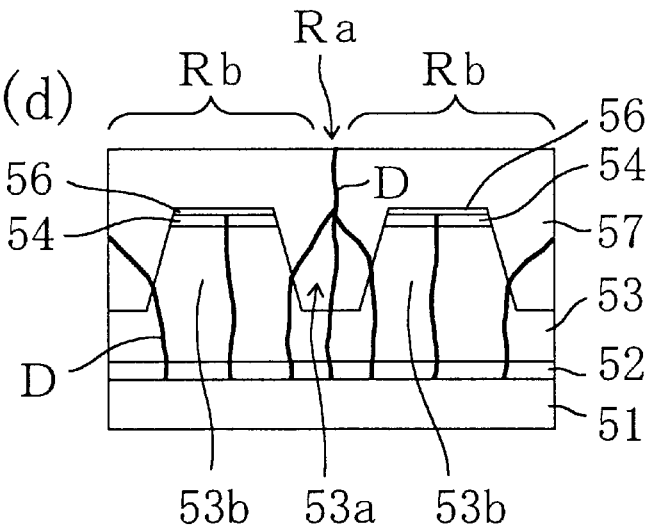

In the step shown in FIG. 6(d), a second GaN layer 57 is formed by MOVPE on the first GaN layer 53 including the top epitaxial mask 56. During this epitaxial growth, no GaN crystal will be epitaxially grown on the top epitaxial mask 56 that is an oxide film made of an Al oxide. The top epitaxial mask 56 therefore functions as a growth suppression layer that suppresses growth of the second GaN layer 57.

In the upper portion (especially the surface portion) of the second GaN layer 57, lattice defects D propagating from the first GaN layer 53 exist only in the regions located above the center of the concave portions 53a, and in the other regions, lattice defects D propagating from the first GaN layer 53 hardly exist. That is, the second GaN layer 57 has defect regions Ra located above the center of the concave portions 53a of the first GaN layer 53 and the other regions in which the number of lattice defects is small, namely, low defect regions Rb.

In the method described above, the first AlAs layer 54 is formed on the convex portions 53b of the first GaN layer 53, and the top epitaxial mask 56 is formed by oxidizing the first AlAs layer 54. The top epitaxial mask 56 therefore nicely adheres to the underlying layer (the first AlAs layer 54). In other words, the adhesion to the underlying layer improves in this embodiment compared with the first embodiment in which the top epitaxial mask made of $SiO_2$ is formed on the substrate made of GaN. This effectively prevents the top epitaxial mask 56 from coming off during the formation of the second GaN layer 57, and thus the fabrication yield of the second GaN layer 57 improves.

In particular, in this embodiment, the first AlAs layer 54 that is susceptible to oxidation is formed on the first GaN layer 53 as the underlying layer of the top epitaxial mask 56. Therefore, the top epitaxial mask 56 can be easily formed without the fear of oxidizing the exposed portions of the first GaN layer 53 at the bottom surfaces and side faces of the concave portions 53a during the oxidation process.

In the oxidation process, in particular, at least the surface of the AlAs layer 54 is oxidized using water vapor that is a gas containing oxygen as a constituent element. This facilitates the formation of the top epitaxial mask 56 made of an oxide film.

In the method described above, also, the first GaN layer 53 and the first AlAs layer 54 are etched by reactive ion etching with a gas containing chlorine. Therefore, the first GaN layer 53 and the first AlAs layer 54 can be easily etched into a desired shape.

Propagation Process of Lattice Defect with Epitaxial Growth

Figure 7A:
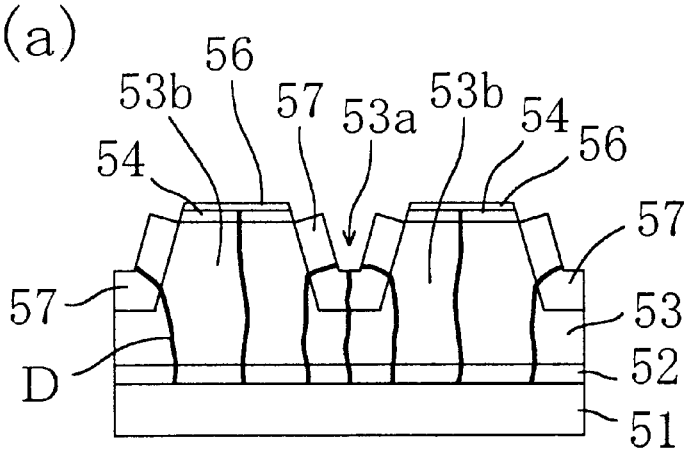
FIGS. 7(a) through 7(c) are cross-sectional views illustrating the initial through final stages of an epitaxial growth process of a second GaN layer in the fifth embodiment.
Figure 7B:
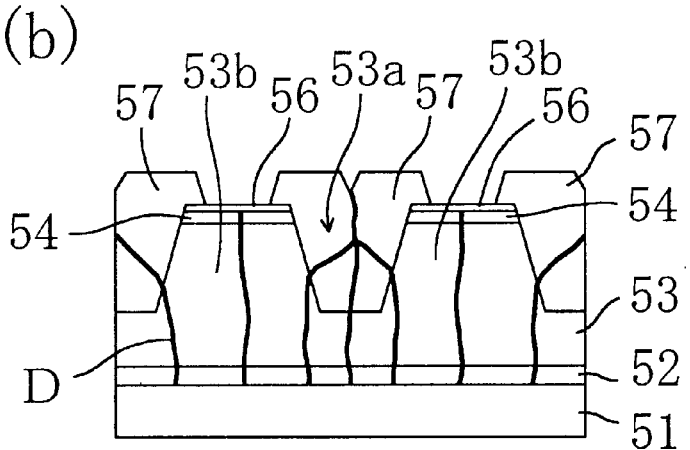
Figure 7C:
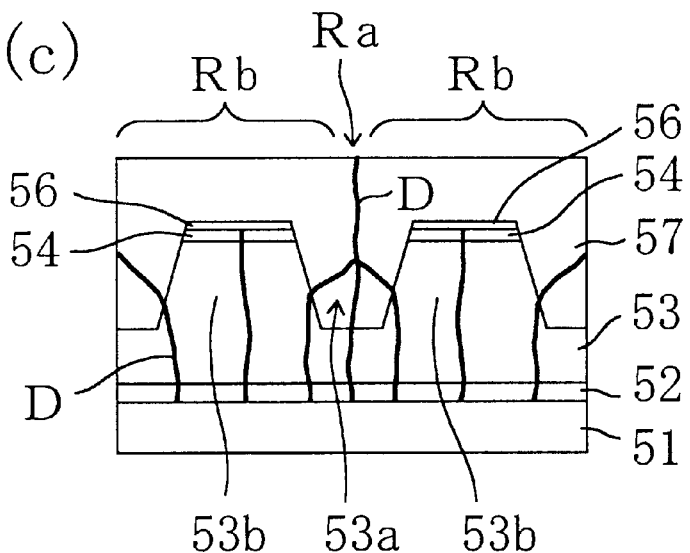

Described hereinafter is how the second GaN layer 57 is formed by MOVPE after the formation of the top epitaxial mask 56. FIGS. 7(a) through 7(c) are cross-sectional views illustrating the initial through final stages of the epitaxial growth of the second GaN layer 57.

Referring to FIG. 7(a), at the initial stage of the growth of the second GaN layer 57, lattice defects D that exist in the first GaN layer 53 and are exposed on the bottom surface and the side faces of each of the concave portions 53a propagate into the second GaN layer 57 with the growth of the second GaN layer 57. As the second GaN layer 57 is deposited, the lattice defects D that have propagated from the bottom surface and the side faces of the concave portion 53a concentrate in a narrow region of the second GaN layer 57 located in the center of the concave portion 53a. The reason is as follows. The GaN crystals epitaxially grow from the side faces of the concave portion 1a in the direction roughly normal to the side faces, and thus the epitaxial growth directions of the GaN crystals from the side faces of the concave portion 53a are inclined toward the center of the concave portion 53a. Therefore, streaky lattice defects D in the first GaN layer 53 that propagate into the second GaN layer 57 from the side faces of the convex portion 53b extend in directions roughly normal to the side faces of the convex portions 53b. Contrarily, lattice defects D in the first GaN layer 53 that propagate into the second GaN layer 57 from the bottom surface of the concave portion 53a extend roughly vertically toward near the center of the concave portion 53a. As a result, the lattice defects D extending from the bottom surface of the concave portion 53a and the lattice defects D extending from the side faces of the concave portion 1a concentrate in the region of the second GaN layer 57 located in the center of the concave portion 53a.

When the major surface of the first GaN layer 53 is the (0001) plane that is the densest plane, the epitaxial growth rate is low on the bottom surface of the concave portion 1a that is the (0001) plane. This especially facilitates the lattice defects D to swiftly concentrate in the region of the second GaN layer 57 located in the center of the concave portion 53a.

No GaN crystal grows from the top epitaxial mask 56. However, GaN crystals grown from the side faces of the convex portions 53b in a direction roughly normal to the side faces further grow in the side direction from the sides thereof, to thereby permit GaN crystals to be deposited along the surface of the top epitaxial mask 56. During this growth, lattice defects D exposed on the side faces of the convex portions 53b, if any, propagate into the second GaN layer 57 in a direction normal to the side faces of the convex portions 53b. Therefore, presumably, the lattice defects D in the first GaN layer 53 hardly propagate into the portions of the second GaN layer 57 that have been deposited by the side-direction growth of the GaN crystals grown from the side faces of the convex portions 53b in a direction roughly normal to the side faces.

As the epitaxial growth of the second GaN layer 57 proceeds, as shown in FIG. 7(b), a number of lattice defects D concentrating in the region of the second GaN layer 57 located near the center of the concave portion 53a are finally united into one streak. The GaN crystals covering the side faces of the stripes of the top epitaxial mask 56 extend in the lateral direction to cover the top surface of the top epitaxial mask 56. During this growth, the lattice defects D in the first GaN layer 53 presumably hardly propagate into the portions of the second GaN layer 57 that have been deposited by the side-direction growth of the GaN crystals grown from the side faces of the convex portions 53b in a direction roughly normal to the side faces, as described above.

As the epitaxial growth of the second GaN layer 57 further proceeds, as shown in FIG. 7(c), the second GaN layer 57 covers the overall surfaces of the concave portions 53a and the convex portions 53b of the first GaN layer 53, and the top surface of the second GaN layer 57 is flattened. In the upper portion (especially in the surface portion) of the resultant second GaN layer 57, the lattice defects D propagating from the first GaN layer 53 only exist in the regions located above the center of the concave portions 53a. In the other regions, lattice defects D propagating from the first GaN layer 53 hardly exist. That is, the second GaN layer 57 has defect regions Ra located above the center of the concave portions 1a of the first GaN layer 53 and the other regions in which the number of lattice defects is small, namely, low defect regions Rb.

Examination was made for the semiconductor devices and the fabrication methods thereof of the present invention, and the following were found.

In this embodiment, the top epitaxial mask 56 is made of an oxide film formed by oxidizing the first AlAs layer 54. In comparison with the top epitaxial mask 3 made of the SiO$_2$ film deposited on the top surfaces of the convex portions of the substrate 1 (GaN substrate) as in the first embodiment, the top epitaxial mask 56 in this embodiment was found better in the adhesion to the underlying layer. This is presumably because the adhesion between the AlAs layer and the GaN layer is higher than the adhesion between the SiO$_2$ film and the GaN substrate, and also the adhesion between the AlAs layer and the oxide film (top epitaxial mask) formed by oxidizing the surface portion of the AlAs layer is high. It was also found that the growth rate in the lateral direction, that is, the growth rate along the surface of the AlAs layer was high.

As a result, the fabrication yield of the semiconductor device in this embodiment was as high as 90% or more, while the fabrication yield was 50% or less for a semiconductor device in which the top epitaxial mask made of SiO$_2$ was directly formed on the first GaN layer 53 as in the first embodiment. This high fabrication yield in this embodiment is presumably due to the improvement in the adhesion between the top epitaxial mask and the underlying layer.

The surface of the second GaN layer 57 formed by the method of this embodiment was observed with a transmission electron microscope. As a result, it was found that the defect density reduced to $1 \times 10^5/\text{cm}^2$.

Structure of Semiconductor Laser Device

Figure 8:
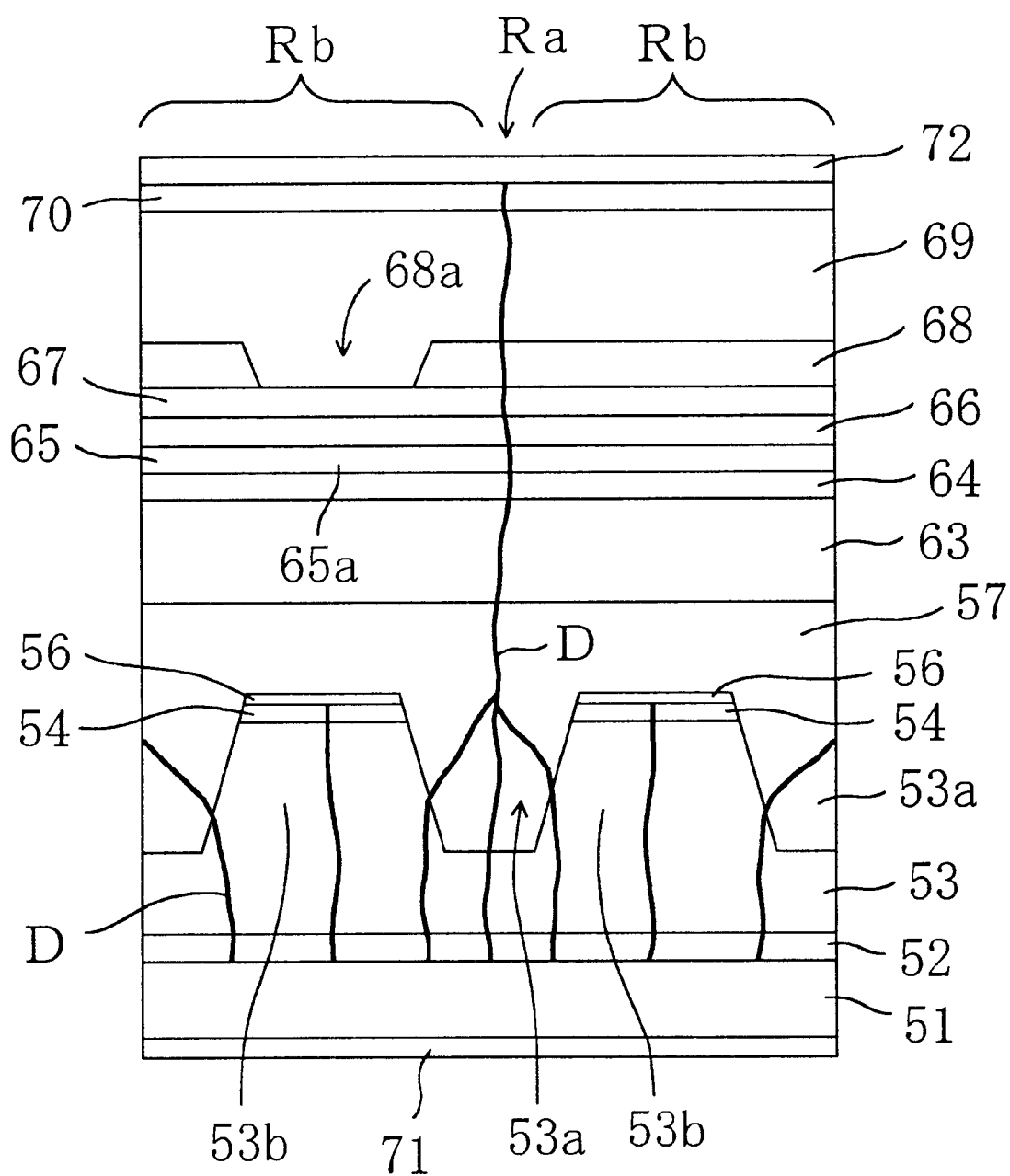
FIG. 8 is a cross-sectional view of the semiconductor device of the fifth embodiment of the present invention.

Next, as shown in FIG. 8, epitaxially grown on the second GaN layer 57 sequentially by MOVPE are: an n-type AlGaN cladding layer 63 having a thickness of 1 μm (mixed crystal ratio of Al:Ga is 10:90); an n-type GaN optical guide layer 64 having a thickness of 0.3 μm; an InGaN multiple quantum well active layer 65; a p-type GaN optical guide layer 66 having a thickness of 0.05 μm; and a first p-type AlGaN cladding layer 67 having a thickness of 0.05 μm. The InGaN multiple quantum well active layer 65 is composed of an InGaN barrier layer having a thickness of 3 nm (not shown, mixed crystal ratio of In:Ga is 3:97) and an InGaN well layer (not shown, mixed crystal ratio of In:Ga is 15:85).

During the crystal epitaxial growth, the lattice defects D in the second GaN layer 57 propagate into the n-type AlGaN cladding layer 63, the n-type GaN optical guide layer 64, the InGaN multiple quantum well active layer 65, the p-type GaN optical guide layer 66, and the p-type AlGaN cladding layer 67. Accordingly, the regions of the respective layers located above the center of the concave portions 1a constitute defect regions Ra that have the lattice defects D, while the other regions constitute regions in which the number of lattice defects is small, namely, low defect regions Rb.

Subsequently, on the first p-type AlGaN cladding layer 67, formed is a current narrowing layer 68 having a thickness of 0.5 μm that has a 2 μm wide opening 68a. The region of the InGaN multiple quantum well active layer 65 located below the opening of the current narrowing layer 68 constitutes an active region 65a of the semiconductor laser device. Therefore, in the formation of the current narrowing layer 68, it is arranged so that the opening is located above the low defect region Rb of the underlying first p-type AlGaN cladding layer 67. In this way, the number of lattice defects D can be reduced in the active region 65a of the semiconductor laser device. Thus, the laser oscillation function of the active region 65a is prevented from deteriorating, and the reliability of the semiconductor laser device can be improved.

In this embodiment, as the material of the current narrowing layer 68, used is n-type AlGaN that is opposite in conductivity type to the first p-type AlGaN cladding layer 67. Alternatively, a nitride semiconductor other than AlGaN, such as HaN, may also be used as the material of the current narrowing layer 68. An insulator such as AlN and SiO$_2$ may also be used. In the case of using a nitride semiconductor, the current narrowing layer 68 may be of a conductivity type opposite to that of the first p-type AlGaN cladding layer 67 or may be of the high-resistance type.

On the current narrowing layer 68, epitaxially grown sequentially are a second p-type AlGaN cladding layer 69 having a thickness of 1 μm (mixed crystal ratio of Al:Ga is 10:90) and a p-type GaN contact layer 70 having a thickness of 0.1 μm. Thereafter, an n-type electrode 71 is formed on the Si substrate 51, and a p-type electrode 72 is formed on the p-type GaN contact layer 70.

With the above construction, a voltage is applied through the n-type electrode 71 and the p-type electrode 72, to enable the active region 65a in the InGaN multiple quantum well active layer 65 to emit light.

During the crystal epitaxial growth, the lattice defects D in the second GaN layer 57 propagate into the n-type AlGaN cladding layer 63, the n-type GaN optical guide layer 64, the InGaN multiple quantum well active layer 65, the p-type GaN optical guide layer 66, the p-type AlGaN cladding layer 67, the current narrowing layer 68, the second p-type AlGaN cladding layer 69, and the p-type GaN contact layer 70. Accordingly, the regions of the respective layers located above the center of the concave portions 53a of the first GaN layer 53 constitute defect regions Ra that have the lattice defects D, while the other regions constitute regions in which the number of lattice defects is small, namely, low defect regions Rb.

Thus, in the semiconductor device (semiconductor laser device) of this embodiment, in which the opening 68a of the current narrowing layer 68 is located above the low defect region Rb, it is possible to reduce the density of the lattice defects D in the active region 65a of the InGaN multiple quantum well active layer 65 located below the opening 68a. Thus, it is possible to improve the life and reliability of the semiconductor laser device.

A life test was performed for the semiconductor device of this embodiment and a conventional semiconductor device. The life test includes operation of keeping constant the wavelengths of laser light oscillated by a number of semiconductor laser devices at a temperature of 100° C. In the conventional semiconductor laser devices, about a half of the samples were no more operable 1000 hours after the start of the life test. The remaining half exhibited significant deterioration in laser oscillation function, such as rise of the operating current by 50% on average. In the semiconductor laser of this embodiment, all the samples were still operable 1000 hours after the start of the life test. The rise of the operating current was 2% on average. Thus, the reliability improved in the semiconductor device of this embodiment.

(Sixth embodiment)

FIGS. 9(a) through 9(d) are cross-sectional views illustrating a fabrication process of a semiconductor device of the sixth embodiment of the present invention. In this embodiment, the Si substrate 51 and the MOVPE apparatus used, as well as the pretreatment of the Si substrate 51 performed prior to the crystal growth, are the same as those in the fifth embodiment.

Figure 9A:
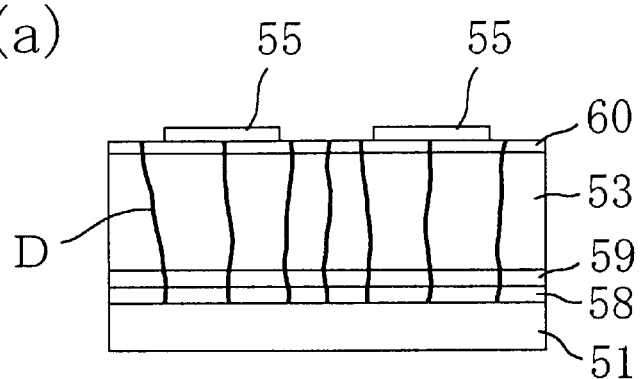
FIGS. 9(a) through 9(d) are cross-sectional views illustrating a fabrication process of a semiconductor device of the sixth embodiment of the present invention.

In the step shown in FIG. 9(a), in the reactor where the temperature of the Si substrate 51 is kept at 500° C., a GaAs layer 58 having a thickness of 200 nm is epitaxially grown on the Si substrate 51, and then a first AlAs layer 59 (underlying semiconductor layer) having a thickness of 100 nm is epitaxially grown on the GaAs layer 58. Although specifically limited, the thickness of the first AlAs layer 59 is preferably 5 to 500 nm, more preferably 50 to 200 nm.

The temperature of the Si substrate 51 is then raised to 1000° C., and TMG (Ga(CH$_3$)$_3$) and NH$_3$ are supplied to epitaxially grow a first GaN layer 53 having a thickness of 3 μm. The thickness of the first GaN layer 53 is just required to be large enough to allow formation of concave and convex steps therein. Specifically, the thickness of the first GaN layer 53 is preferably 100 nm or more, more preferably 1 to 5 μm.

Thereafter, the temperature of the Si substrate 51 is reduced to 500° C., and arsine (AsH$_3$) and TMA are supplied to grow a second AlAs layer 60 having a thickness of 100 nm on the first GaN layer 53. The thickness of the second AlAs layer 60 is just required to be large enough to allow formation of an oxide film therein. Specifically, the thickness of the second AlAs layer 60 is preferably 5 to 500 nm, more preferably 50 to 200 nm.

The substrate is then removed from the MOVPE reactor, and a SiO$_2$ film having a thickness of 100 nm is formed on the second AlAs layer 60 by sputtering. The SiO$_2$ film is then patterned by photolithography and dry etching, to form an etching mask 55. The etching mask 55 is 5 μm and the space between the stripes, that is, the width of the opening between the stripes is 5 μm. The length direction of the stripes is roughly in parallel with the <11–20> orientation (a-axis orientation) of a GaN crystal constituting the substrate 51.

Figure 9B:
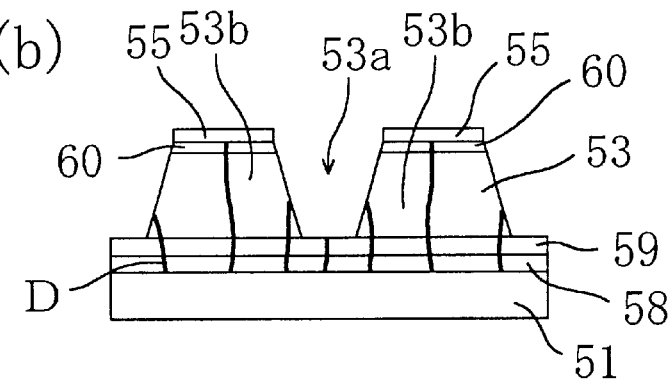

In the step shown in FIG. 9(b), the substrate is put in an etching apparatus, where the portions of the second AlAs layer 60 and the first GaN layer 53 that are exposed in the openings of the etching mask 55 are etched by reactive ion etching, to expose the first AlAs layer 59. As a result, formed are concave portions 53a that extend through the second AlAs layer 60 and the first GaN layer 53 and of which the bottom surface is the top surface of the first AlAs layer 59, leaving non-etched portions between the adjacent concave portions 53a as mesa-shaped convex portions 53b. The side faces at the boundary between the concave portions 53a and the convex portions 53b are tilted. As the etching gas for the reactive ion etching, preferably used is a gas containing chlorine such as BCl$_3$ and CCl$_4$. In this embodiment, a mixed gas of BCl$_3$ and N$_2$ (mixture ratio BCl$_3$:N$_2$=2:1) is fed at a flow rate of about 0.010 (l/m), and the gas pressure in the etching apparatus is set at 67 Pa.

Figure 9C:
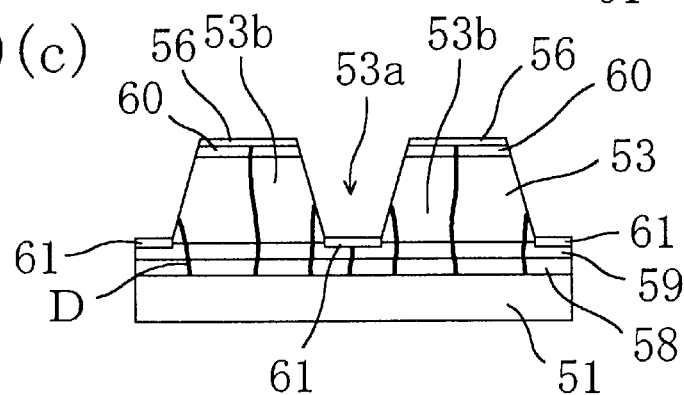

In the step shown in FIG. 9(c), after removal of the etching mask 55 made of the SiO$_2$ film, the substrate is subjected to heat treatment at 400° C. for 30 minutes in a water vapor atmosphere, to oxidize the surface portions of the first and second AlAs layers 59 and 60 forming a bottom epitaxial mask 61 and a top epitaxial mask 56 made of an oxide film on the first and second AlAs layers 59 and 60, respectively. Since the rate of the oxidation of the AlAs layers is significantly high, it is well considered that the portions of the first GaN layer 53 exposed on the side faces of the convex portions 53b have not been oxidized.

Figure 9D:
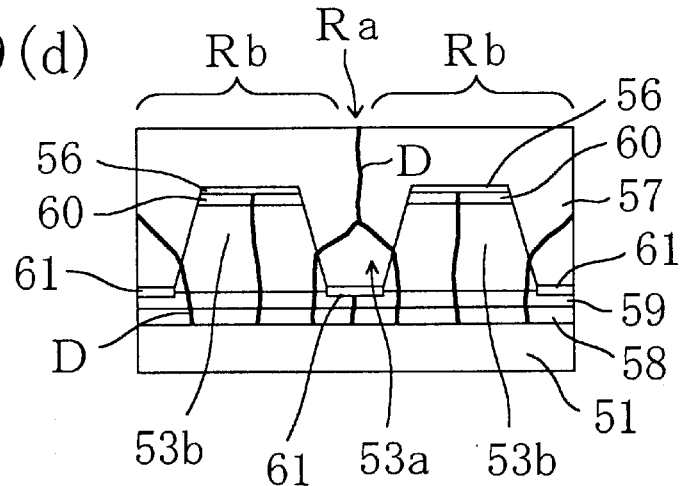

In the step shown in FIG. 9(d), a second GaN layer 57 is formed by MOVPE on the resultant substrate including the epitaxial masks 56 and 61. During this epitaxial growth, no GaN crystal will be epitaxially grown on the epitaxial masks 56 and 61 that are oxide films made of an Al oxide. The epitaxial masks 56 and 61 therefore function as growth suppression layers that suppress growth of the second GaN layer 57.

In the upper portion (especially the surface portion) of the second GaN layer 57, lattice defects D propagating from the first GaN layer 53 exist only in the regions located above the center of the concave portions 53a. In the other regions, lattice defects D propagating from the first GaN layer 53 hardly exist. That is, the second GaN layer 57 has defect regions Ra located above the center of the concave portions 53a of the first GaN layer 53 and the other regions in which the number of lattice defect is small, namely, low defect regions Rb.

Thereafter, as in the fifth embodiment, sequentially formed on a second GaN layer are n-type AlGaN cladding layer 63, an n-type GaN optical guide layer 64, an InGaN multiple quantum well active layer 65, a p-type GaN optical guide layer 66, a p-type AlGaN cladding layer 67, a current narrowing layer 68, a second p-type AlGan cladding layer 69, and a p-type GaN contact layer 70, as shown in FIG. 8. Thereafter, an n-side electrode 71 is formed on the Si substrate 51, and a p-side electrode 72 is formed on the p-type GaN contact layer 70. The respective layers formed above the second GaN layer 57 also have the defect regions Ra and the low defect regions Rb at positions corresponding to those of the second GaN layer 57. In this way, the semiconductor layer device is fabricated. He current narrowing layer 68 is formed so that the opening 68a thereof is located above the low defect region Rb of he underlying first p-type AlGaN cladding layer 67 in the construction where the second GaN layer 57 in FIG. 8 is replaced with the second GaN layer in this embodiment. In this way, the number of lattice defects D can be reduced in the active region 65a of the semiconductor laser device. Thus, the laser oscillation function of the active region 65a is prevented from deteriorating, and the reliability of the semiconductor laser device can be improved.

In the method described above, the second AlAs layer 60 is formed on the convex portions 53b of the first GaN layer 53, and the top epitaxial mask 56 is formed by oxidizing the second AlAs layer 60. The top epitaxial mask 56 therefore nicely adheres to the underlying layer (the second AlAs layer 60). In other words, the adhesion to the underlying layer improves in this embodiment compared with the first embodiment in which the top epitaxial mask made of $SiO_2$ is formed on the substrate made of GaN. This effectively prevents the top epitaxial mask 56 from coming off during the formation of the second GaN layer 57, and thus the fabrication yield of the second GaN layer 57 improves.

In addition, in the method of this embodiment, the first AlAs layer 59 is exposed on the bottom surface of each of the concave portions 53a. The exposed surface of the first AlAs layer 59 is oxidized forming the bottom epitaxial mask 61 made of an oxide film. Therefore, the adhesion of the bottom epitaxial mask 61 to the first AlAs layer 59 improves in this embodiment compared with that in the second embodiment. Moreover, in this embodiment, compared with the fifth embodiment, lattice defects D hardly propagate into the second GaN layer 57 from the bottom surface of the concave portion 53a, and thus the defect density of the second GaN layer 57 can further be reduced.

Propagation Process of Lattice Defect with Epitaxial Growth

Figure 10A:
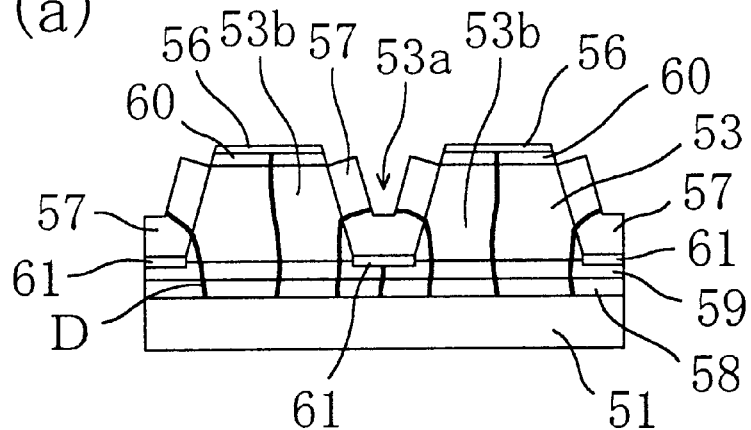
FIGS. 10(a) through 10(c) are cross-sectional views illustrating the initial through final stages of an epitaxial growth process of a second GaN layer in the sixth embodiment.
Figure 10B:
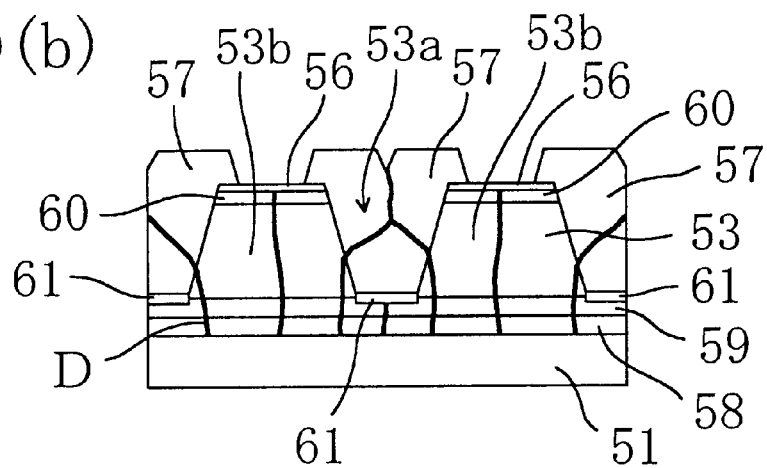
Figure 10C:
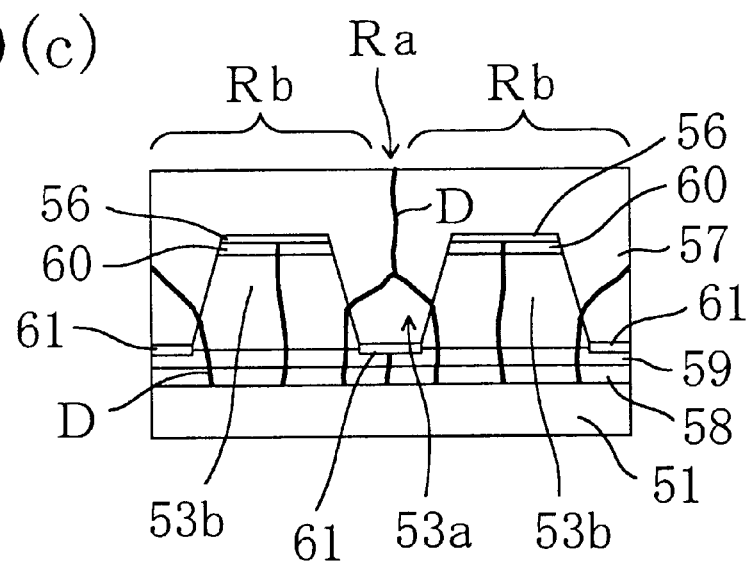

Described hereinafter is how the second GaN layer 57 is formed by MOVPE after the formation of the epitaxial masks 56 and 61. FIGS. 10(a) through 10(c) are cross-sectional views illustrating the initial through final stages of the epitaxial growth of the second GaN layer 57.

Referring to FIG. 10(a), at the initial stage of the growth of the second GaN layer 57, GaN crystals are hardly grown from the top surface of each of the convex portions 53b and the bottom surface of each of the concave portions 53a that are respectively covered with the top epitaxial mask 56 and the bottom epitaxial mask 61. Instead, the second GaN layer 57 is grown laterally from the exposed side faces of the convex portions 53b of the first GaN layer 53. Therefore, lattice defects D exposed on the top surface of the first AlAs layer 59 are prevented from propagating into the second GaN layer 57 by the bottom epitaxial mask 61 made of an oxide film formed on the bottom surface of each of the concave portions 53a. Likewise, lattice defects D exposed on the top surface of each of the convex portions 53b of the first GaN layer 53 are prevented from propagating into the second GaN layer 57 by the top epitaxial mask 56. As a result, among the lattice defects D in the first GaN layer 53, only those exposed on the side faces of the concave portions 53b propagate in a direction roughly normal to the side faces of the convex portions 53b. In this embodiment, therefore, the density of the lattice defects D propagating into the second GaN layer 57 can further be reduced, compared with the fifth embodiment.

As the epitaxial growth of the second GaN layer 57 proceeds, as shown in FIG. 10(b), the GaN crystals growing from the opposite side faces of the concave portion 53a join with each other near the center of the concave portion 53a, so that the concave portion 53a is filled with the GaN crystals. As in the fifth embodiment, the lattice defects D propagating in the concave portion 53a extend toward the center of the concave portion 53a with the epitaxial growth of the second GaN layer 57, to finally be united into one streak. The GaN crystals also grow laterally from the side faces of the stripes of the top epitaxial mask 56 to the top surfaces thereof covering the top epitaxial mask 56. Since the lattice defects D extend in a direction roughly normal to the side faces of the convex portions 53b, no lattice defect D exists in the top end portions of the second GaN layer 57 at the stage shown in FIG. 10(a). Therefore, no lattice defect D propagates into the GaN crystals covering the top surface of the top epitaxial mask 56.

As the epitaxial growth of the second GaN layer 57 further proceeds, as shown in FIG. 10(c), the second GaN layer 57 covers the overall surfaces of the concave portions 53a and the convex portions 53b of the first GaN layer 53, and the top surface of the second GaN layer 57 is roughly flattened. In the upper portion (especially in the surface portion) of the resultant second GaN layer 57, the lattice defects D propagating from the first GaN layer 53 only exist in the regions thereof located above the center of the concave portions 53a. In the other regions, lattice defects D propagating from the first GaN layer 53 hardly exist. That is, the second GaN layer 57 has defect regions Ra located above the center of the concave portions 53a of the first GaN layer 53 and the other regions in which the number of lattice defect is small, namely, low defect regions Rb.

The surface of the second GaN layer formed by the method of this embodiment was observed with a transmission electron microscope. As a result, it was found that the defect density reduced to $1\times10^4/cm^2$.

The fabrication yield in this embodiment was as high as 90% or more, while the fabrication yield was 50% or less for a semiconductor device in which the top epitaxial mask made of $SiO_2$ was directly formed on the first GaN layer 53 as in the first embodiment. This is presumably due to the improvement in the adhesion between the top and bottom epitaxial masks and the respective underlying layers.

In the semiconductor device of this embodiment, the density of the lattice defects D in the region of the n-type GaN layer 53 located in the center of the concave portion 53a is reduced swiftly after the start of the epitaxial growth. Therefore, the n-type GaN layer 11 can be made thinner than that in the first embodiment. In addition, is this embodiment, it is expected to obtain the effect that the low defect region Ra can be made narrower than that in the fifth embodiment.

(Seventh embodiment)

FIGS. 11(a) through 11(d) are cross-sectional views illustrating a fabrication process of a semiconductor device of the seventh embodiment of the present invention. In this embodiment, the Si substrate 51 and the MOVPE apparatus used, as well as the pretreatment of the Si substrate 51 performed prior to the crystal growth, are the same as those in the fifth embodiment.

Figure 11A:
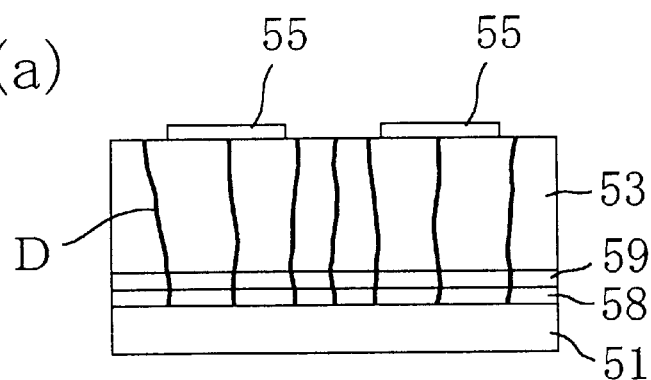
FIGS. 11(a) through 11(d) are cross-sectional views illustrating a fabrication process of a semiconductor device of the seventh embodiment of the present invention.

In the step shown in FIG. 11(a), in the reactor where the temperature of the Si substrate 51 is kept at 500° C., a GaAs layer 58 having a thickness of 200 nm is epitaxially grown on the Si substrate 51, and then a first AlAs layer 59 having a thickness of 100 nm is epitaxially grown on the GaAs layer 58. Although not specifically limited, the thickness of the first AlAs layer 59 is preferably 5 to 500 nm, more preferably 50 to 200 nm.

The temperature of the Si substrate 51 is then raised to 1000° C., and TMG (Ga(CH$_3$)$_3$) and NH$_3$ are supplied to epitaxially grow a first GaN layer 53 having a thickness of 3 μm on the second AlAs layer 59. The thickness of the first GaN layer 53 is just required to be large enough to allow formation of concave and convex steps therein. Specifically, the thickness of the first GaN layer 53 is preferably 100 nm or more, more preferably 1 to 5 μm.

The substrate is then removed from the MOVPE reactor, and a S1$_2$ film having a thickness of 100 nm is formed on by sputtering. The SiO$_2$ film is then patterned by photolithography and dry etching, to form an etching mask 55. The etching mask 55 has a periodic stripe pattern having a stripe width of 5 μm and a space between stripes of 5 μm. That is, the width of the stripes constituting the stripe pattern of the etching mask 55 is 5 μm and the space between the stripes, that is, the width of the opening between the stripes is 5 μm. The length direction of the stripes is roughly in parallel with the <11–20> orientation (a-axis orientation) of a GaN crystal constituting the substrate 51.

Figure 11B:
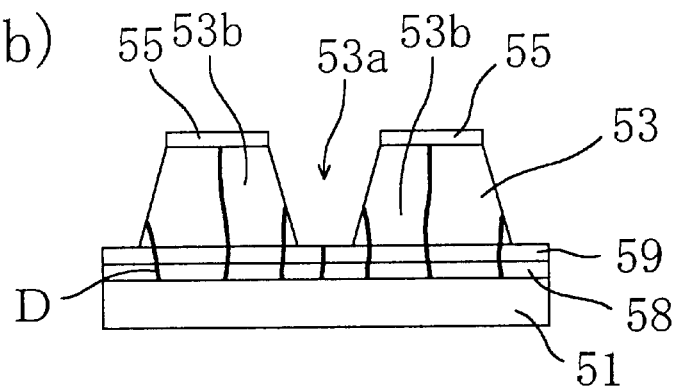

In the step shown in FIG. 11(b), the substrate is put in an etching apparatus, where the portions of the second AlAs layer 60 and the first GaN layer 53 that are exposed in the openings of the etching mask 55 are etched by reactive ion etching, to expose the first AlAs layer 59. As a result, formed are concave portions 53a that extend through the second AlAs layer 60 and the first GaN layer 53 and of which the bottom surface is the top surface of the first AlAs layer 59, leaving non-etched portions between the adjacent concave portions 53a as mesa-shaped convex portions 53b. The side faces at the boundary between the concave portions 53a and the convex portions 53b are tilted. As the etching gas for the reactive ion etching, preferably used is a gas containing chlorine such as BCl$_3$ and CCl$_4$. In this embodiment, a mixed gas of BCl$_3$ and N$_2$ (mixture ratio BCl$_3$:N$_2$=2:1) is fed at a flow rate of about 0.010 (l/m), and the gas pressure in the etching apparatus is set at 67 Pa.

Figure 11C:
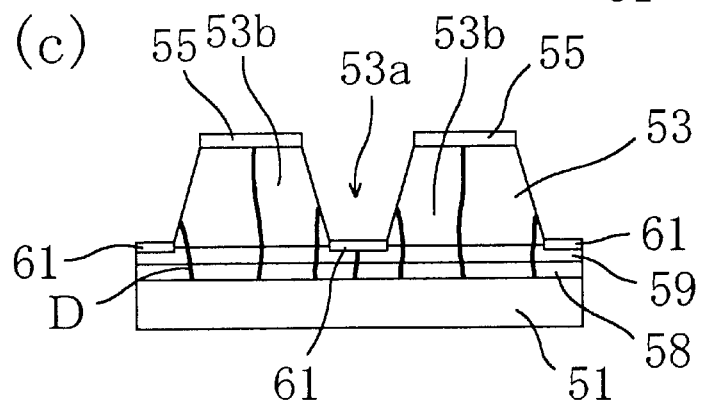

In the step shown in FIG. 11(c), the substrate is subjected to heat treatment at 400° C. for 30 minutes in a water vapor atmosphere, to oxidize the surface portion of the first AlAs layer 59 forming a bottom epitaxial mask 61 made of an oxide film on the first AlAs layer 59. Since the rate of the oxidation of the AlAs layer is significantly high, it is well considered that the portions of the first GaN layer 53 exposed on the side faces of the convex portions 53b have not been oxidized.

Figure 11D:
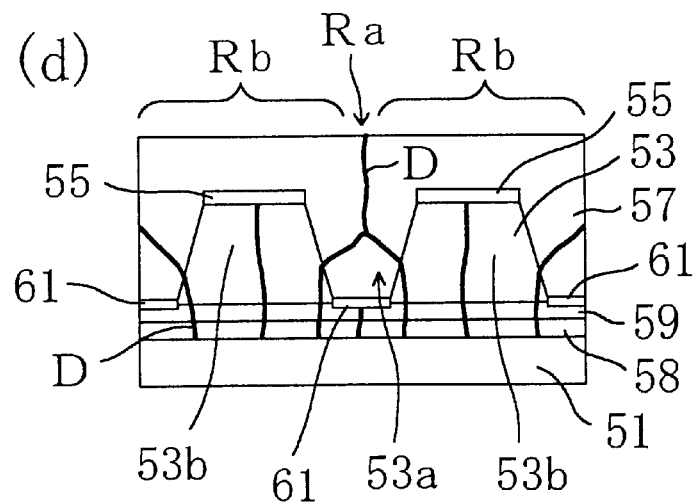
Figure 12:
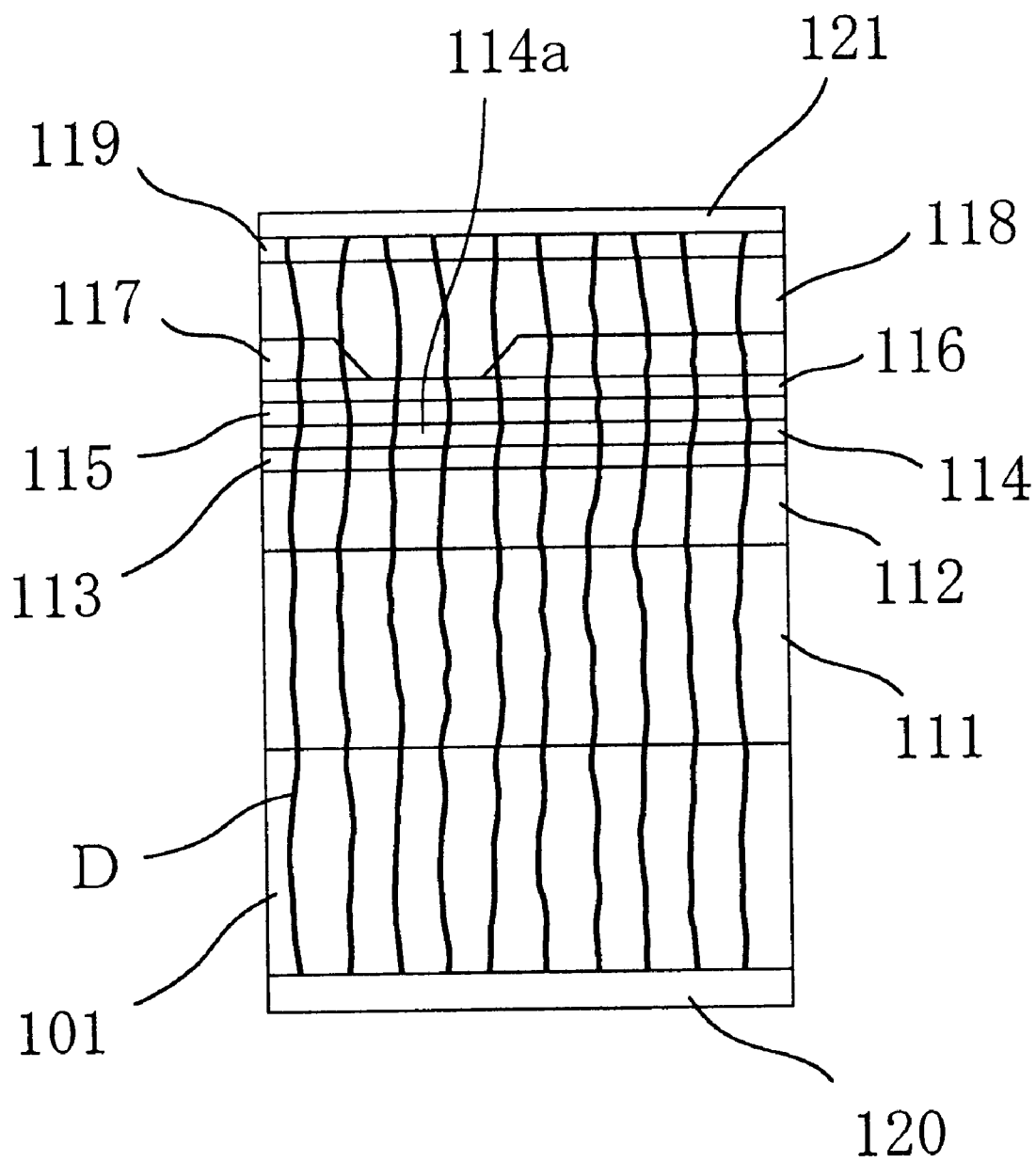
FIG. 12 is a cross-sectional view of a conventional semiconductor laser device using a nitride semiconductor.

In the step shown in FIG. 11(d), a second GaN layer 57 is formed on the resultant substrate including the etching mask 55 and the bottom epitaxial mask 61 by MOVPE. During this epitaxial growth, no GaN crystal will be epitaxially grown on the bottom epitaxial mask 61 that is an oxide film made of an Al oxide and on the etching mask 55. The bottom epitaxial mask 61 and the etching mask 55 therefore function as growth suppression layers that suppress growth of the second GaN layer 57.

In the method of this embodiment described above, the first AlAs layer 59 is exposed on the bottom surface of each of the concave portions 53a, and the exposed surface of the first AlAs layer 59 is oxidized forming the bottom epitaxial mask 61 made of an oxide film. Therefore, the adhesion of the bottom epitaxial mask 61 to the first AlAs layer 59 improves in this embodiment compared with that in the second embodiment. Moreover, in this embodiment, compared with the fifth embodiment, lattice defects D hardly propagate into the second GaN layer 57 from the bottom surface of the concave portion 53a, and thus the defect density of the second GaN layer 57 can be further reduced.

In this embodiment, as in the sixth embodiment, in the upper portion (especially in the surface portion) of the resultant second GaN layer 57, the lattice defects D propagating from the first GaN layer 53 only exist in the regions located above the center of the concave portions 53a. In the other regions, lattice defects D propagating from the first GaN layer 53 hardly exist. That is, the second GaN layer 57 has defect regions Ra located above the center of the concave portions 53a of the first GaN layer 53 and the other regions in which the number of lattice defect is small, namely, low defect regions Rb.

Thereafter, as in the fifth embodiment, sequentially formed on the second GaN layer 57 are an n-type AlGaN cladding layer 63, an n-type GaN optiacal guide layer 64, an InGaN multiple quantum well active layer 65, a p-type GaN optical guide layer 66, a p-type AlGaN cladding layer 67, a current narrowing layer 68, a second p-type AlGaN cladding layer 69, and a p-type GaN contact layer 70, as shown in FIG. 8. Thereafter, an n-side electrode 71 is formed on the Si substrate 51, and a p-side electrode 72 is formed on the p-type GaN contact layer 70. The respective layers formed above the second GaN layer 57 also have the defect regions Ra and the low defect regions Rb at positions corresponding to those of the second GaN layer 57. In this way, the semiconductor layer device is fabricated. The current narrowing layer 68 is formed so that the opening 68a thereof is located above the low defect region Rb of the underlying first p-type AlGaN cladding layer 67 in the construction where the second GaN layer 57 in FIG. 8 is replaced with the second GaN layer in the embodiment. In this way, the number of lattice defects D in the active region 65a of the semiconductor laser device can be reduced. Thus, the laser oscillation function of the active region 65a is prevented from deteriorating, and reliability of the semiconductor laser device can be improved.

The surface of the second GaN layer formed by the method of this embodiment was observed with a transmission electron microscope. As a result, it was found that the defect density reduced to $1\times10^4/cm^2$.

The fabrication yield in this embodiment was as high as 70% or more, while the fabrication yield was 50% or less for a semiconductor device in which the top epitaxial mask and the bottom epitaxial mask made of SiO$_2$ were directly formed on the first GaN layer 53 as in the second embodiment. This is presumably due to the improvement in the adhesion between the bottom epitaxial mask and the underlying layer.

(Other embodiments)

Although the semiconductor laser devices were exemplified in the above embodiments, the present invention is not limited to these embodiments. For example, the present invention is applicable to optical devices such as a light emitting diode (LED). In this application, the density of lattice defects in the active region of the device can be reduced, and thus the light emission intensity and the life of the device can be improved. The present invention is also applicable to a field effect transistor (FET). In this application, the density of lattice defects in the active region (especially, the channel region) of the FET can be reduced, and therefore, it is possible to suppress hindrance of traveling of carriers in the active region. As a result, improvement of the current driving ability, suppression of inferior operation, and the like are attained.

As for the substrate, it is possible to use a substrate including a semiconductor layer such as a GaN crystal layer epitaxially grown on a heterogeneous substrate such as a sapphire substrate. For example, in place of the GaN substrate 1 in the first to fourth embodiments and the Si substrate 51 in the fifth to seventh embodiments, it is possible to use a substrate including a GaN crystal layer (semiconductor layer) epitaxially grown on a sapphire substrate (heterogeneous substrate such as an insulating substrate) of which the major surface is the c-plane ((0001) plane). In this case, in particular, when an insulating substrate is used, the heterogeneous substrate including an insulating substrate, is preferably removed before the formation of the n-side electrode 20 or 71 shown in FIG. 2 or 8. This permits easy formation of the n-side electrode 20 or 71 in contact with the semiconductor layer, and thus facilitates the use of the device as a semiconductor laser device.

Examples of the above heterogeneous substrate include a sapphire substrate having a c-plane, r-plane, or a-plane major surface, a GaAs substrate, a SiC substrate, a ZnO substrate, and a substrate in which the major surface of any of these substrates is off-angled.

MOVPE was employed for the epitaxial growth of the semiconductor layers in the above embodiments. The epitaxial growth method is not limited to those specified in the above embodiments, but molecular beam epitaxial growth (MBE), hydride vapor-phase epitaxial growth (HVPE), and the like may be employed. In particular, HVPE, which can greatly increase the growth rate of the epitaxial growth layers, is suitable for thickening an epitaxial growth layer. For example, as the substrates in the above embodiments, it is possible to use a substrate including a thick GaN layer formed on a heterogeneous substrate such as a sapphire substrate. After epitaxial growth of a GaN layer, the heterogeneous substrate is removed. As a result, a low-defect GaN layer can be obtained.

In the above embodiments, thermal oxidation in an $H_2O$ atmosphere was employed for formation of the oxide film. Alternatively, other oxidation methods may be employed including a method where a substrate is put in an aqueous solution of hydrogen peroxide and boiled and a method where a substrate is left to stand in an ozone atmosphere.

The periodic stripe pattern was used as the etching mask and the epitaxial mask in the above embodiments, but the shape of the masks is not limited to the periodic strip pattern. The same effect can also be obtained by using masks of a circular pattern, a grid pattern, an aperiodic pattern, and the like.

In the above embodiments, the convex portions were presumed to have a flat top surface. The top surface of the convex portions is not necessarily flat, but may be round at both sides. The effect of the present invention can be obtained as long as the top epitaxial mask covers the main portion (especially the flat portion) of the top surface of each convex portion in the embodiments other than the third and fourth embodiments.

The effect of the present invention is also obtainable when each concave portion does not have a broad bottom surface, for example, when it has a V-shaped valley-like cross section. With the concave portion in this shape, also, lattice defects in the crystal layer epitaxially growing from the side faces of the concave portion concentrate near the center of the concave portion. In practice, however, it is not necessary to continue etching until the flat bottom surface of the concave portion is sharpened during the formation of the convex portion.

In the above embodiments, the stripe pattern was formed to have a number of convex portions. The fundamental effect of the present invention is also obtainable when only one convex portion is formed. In this case, the region of the epitaxially grown semiconductor layer (the n-type GaN layer 11 or the second GaN layer 57) located above the top surface of the convex portion constitutes the low defect region Rb where lattice defects hardly exist due to the function described in the above embodiments. By forming the active region of a device such as a semiconductor laser device in this low defect region Rb, the fundamental effect of the present invention is obtained.

Examples of typical Al-containing semiconductors (in particular, Group III compound semiconductors) according to the present invention include AlAs, AlN, AlGaAs, AlGaN, and $Al_xGa_{1-x}As_yN_{1-y}$ ($0<x\leq1$, $0\leq y\leq1$). The oxidation rate is higher with a larger content of Al. In particular, AlAs provides significantly high oxidation rate.

An amorphous phase may sometimes be grown slightly on an Al-containing Group III compound semiconductor layer. This does not actually influence the operation of the semiconductor device, and thus can be considered as the state that growth is hardly observed.

What is claimed is:

1. A method for fabricating a semiconductor device, comprising the steps of:
    (a) forming a coat layer on a first semiconductor layer of a substrate, the coat layer being made of a material having a function of suppressing epitaxial growth of a semiconductor on the first semiconductor layer;
    (b) etching the coat layer and the first semiconductor layer to form in the first semiconductor layer at least one convex portion having a top surface and a side face intersecting with the top surface while forming a top epitaxial mask made of the coat layer on the at least one convex portion;
    (c) forming a second semiconductor layer on the first semiconductor layer by epitaxial growth after the step (b); and
    (d) forming a semiconductor element operating using a region of the second semiconductor layer located above the convex portion as an active region.

2. The method for fabricating a semiconductor device of claim 1, wherein in the step (b), at least two convex portions are formed, and
    the method further comprises the step of forming a bottom epitaxial mask on a bottom surface of a concave portion sandwiched by the two convex portions after the step (b) and before the step (c).

3. The method for fabricating a semiconductor device of claim 1, further comprising the steps of:
    forming an etching mask film after the step (a) and before the step (b); and
    patterning the etching mask film to form an etching mask after the step (a) and before the step (b),
    wherein in the step (b), the coat layer and the first semiconductor layer are etched using the etching mask.

4. The method for fabricating a semiconductor device of claim 1, wherein in the step (a), a film made of a material capable of selectively etching the first semiconductor layer is formed as the coat layer,
    in the step (b), the coat layer is patterned to form an etching mask, and then the first semiconductor layer is etched using the etching mask, and
    in the step (c), the second semiconductor layer is epitaxially grown using the etching mask as an epitaxial mask.

5. The method for fabricating a semiconductor device of claim 1, wherein in the step (a), a $SiO_2$ film is formed as the coat layer.

6. A method for fabricating a semiconductor device, comprising the steps of:
(a) forming an etching mask on a first semiconductor layer of a substrate;
(b) etching the first semiconductor layer using the etching mask to form in the first semiconductor layer at least one convex portion having a top surface having a size smaller than the etching mask and a side face intersecting with the top surface;
(c) forming a second semiconductor layer by epitaxial growth on the first semiconductor layer after the step (b); and
(d) forming a semiconductor element operating using a region of the second semiconductor layer ranging from the side face of the convex portion to part of a bottom surface of a concave portion as an active region.

7. The method for fabricating a semiconductor device of claim 6, wherein in the step (a), the etching mask is a film made of a material etched during the etching in the step (b) and reduced in lateral size by the etching.

8. The method for fabricating a semiconductor device of claim 6, wherein in the step (a), the etching mask is made of a material having translucency, and
in the step (b), the size of the top surface of the convex portion is reduced by etching a portion of the first semiconductor layer located below the etching mask while irradiating the first semiconductor layer with light from above the etching mask.

9. The method for fabricating a semiconductor device of claim 6, wherein in the step (b), a tilt angle of the side face of the convex portion is controlled to be a desired value by selection of etching conditions.

10. A method for fabricating a semiconductor device, comprising the steps of:
(a) forming a first semiconductor layer made of a Group III nitride on a substrate;
(b) forming a second semiconductor layer made of a material having a function of adhering to the first semiconductor layer on the first semiconductor layer;
(c) forming an etching mask on the second semiconductor layer;
(d) etching the first and second semiconductor layers using the etching mask to form in the first semiconductor layer at least one convex portion having a top surface and a side face intersecting with the top surface;
(e) forming a top epitaxial mask on the second semiconductor layer remaining on the top surface of the convex portion of the first semiconductor layer;
(f) forming a third semiconductor layer on the first semiconductor layer by epitaxial growth after the step (e); and
(g) forming a semiconductor element operating using a region of the third semiconductor layer located above the convex portion as an active region.

11. The method for fabricating a semiconductor device of claim 10, wherein in the step (c), the etching mask is formed by patterning a SiO$_2$ film.

12. The method for fabricating a semiconductor device of claim 10, wherein the step (c) is performed by reactive ion etching with a gas containing chlorine.

13. A method for fabricating a semiconductor device, comprising the steps of:
(a) forming an Al-containing underlying semiconductor layer and a first semiconductor layer made of a Group III nitride sequentially on a substrate;
(b) forming an etching mask on the first semiconductor layer;
(c) etching the first semiconductor layer using the etching mask to form in the first semiconductor layer at least one convex portion having a top surface and a side face intersecting with the top surface;
(d) forming a top epitaxial mask on the top surface of the convex portion of the first semiconductor layer;
(e) forming a second semiconductor layer on the first semiconductor layer by epitaxial growth after the step (d); and
(f) forming a semiconductor element operating using a region of the second semiconductor layer located above the convex portion as an active region.

14. The method for fabricating a semiconductor device of claim 13, further comprising the step of:
forming a third semiconductor layer made of a material having a function of adhering to the first semiconductor layer on the first semiconductor layer after the step (a) and before the step (b),
wherein in the step (b), the etching mask is formed on the third semiconductor layer,
in the step (c), part of the third semiconductor layer is left on the top surface of the convex portion, and
in the step (d), the top epitaxial mask is formed on the part of the third semiconductor layer.

15. The method for fabricating a semiconductor device of claim 14, wherein the third semiconductor layer is an AlAs layer, and
in the step (d), the top epitaxial mask is formed by oxidizing a surface portion of the AlAs layer.

16. The method for fabricating a semiconductor device of claim 15, wherein in the step (c), the first semiconductor layer is etched until the underlying semiconductor layer is exposed to form the mesa-shaped convex portion on the underlying semiconductor layer, and
the method further comprises the step of forming a bottom epitaxial mask by oxidizing an exposed surface portion of the underlying semiconductor layer.

17. A method for fabricating a semiconductor substrate, comprising the steps of:
(a) forming an etching mask on a first semiconductor layer made of a Group III nitride formed on a substrate for crystal growth;
(b) etching the first semiconductor layer using the etching mask to form in the first semiconductor layer at least one convex portion having a top surface and a side face intersecting with the top surface;
(c) forming a second semiconductor layer on the first semiconductor layer by epitaxial growth after the step (b); and
(d) removing the substrate for crystal growth.

18. The method for fabricating a semiconductor substrate of claim 17, further comprising the step of forming a top epitaxial mask used in the step (c) on the top surface of the convex portion of the first semiconductor layer.

19. The method for fabricating a semiconductor substrate of claim 18, wherein the substrate for crystal growth includes a base plate and an Al-containing underlying semiconductor layer formed on the base plate,
in the step (b), the first semiconductor layer is etched until the underlying semiconductor layer is exposed, and
the top epitaxial mask is formed by oxidizing an exposed surface portion of the underlying semiconductor layer before the step (c).

* * * * *